(12) United States Patent
Danilov et al.

(10) Patent No.: US 10,382,554 B1
(45) Date of Patent: Aug. 13, 2019

(54) HANDLING DELETES WITH DISTRIBUTED ERASURE CODING

(71) Applicant: EMC Corporation, Hopkinton, MA (US)

(72) Inventors: Mikhail Danilov, Saint Petersburg (RU); Konstantin Buinov, Prague (CZ)

(73) Assignee: EMC CORPORATION, Hopkinton, MA (US)

( * ) Notice: Subject to any disclaimer, the term of this patent is extended or adjusted under 35 U.S.C. 154(b) by 13 days.

(21) Appl. No.: 15/862,547

(22) Filed: Jan. 4, 2018

(51) Int. Cl.
| | |
|---|---|
| *H04L 29/08* | (2006.01) |
| *G06F 3/06* | (2006.01) |
| *H03M 13/25* | (2006.01) |
| *H03M 13/29* | (2006.01) |
| *H03M 13/00* | (2006.01) |

(52) U.S. Cl.
CPC .......... *H04L 67/1097* (2013.01); *G06F 3/064* (2013.01); *G06F 3/067* (2013.01); *H03M 13/251* (2013.01); *H03M 13/293* (2013.01); *H03M 13/616* (2013.01)

(58) Field of Classification Search
CPC .............................. H04L 67/1097; G06F 3/067
See application file for complete search history.

(56) References Cited

U.S. PATENT DOCUMENTS

| | | | | |
|---|---|---|---|---|
| 2009/0183056 A1* | 7/2009 | Aston | ................. | G06F 11/1004 714/799 |
| 2009/0240880 A1* | 9/2009 | Kawaguchi | ........... | G06F 3/0617 711/114 |
| 2011/0107165 A1* | 5/2011 | Resch | ................. | G06F 11/1076 714/746 |
| 2012/0191675 A1* | 7/2012 | Kim | .................... | G06F 16/1748 707/692 |
| 2013/0238932 A1 | 9/2013 | Resch | | |
| 2013/0290482 A1* | 10/2013 | Leggette | ............ | H04L 67/1097 709/217 |
| 2014/0040417 A1 | 2/2014 | Galdwin et al. | | |

(Continued)

OTHER PUBLICATIONS

Non-Final Office Action received for U.S. Appl. No. 15/792,714 dated Apr. 4, 2019, 20 pages.

*Primary Examiner* — Joseph D Torres
(74) *Attorney, Agent, or Firm* — Amin, Turocy & Watson, LLP

(57) ABSTRACT

Inter-zone network traffic generated during deletion of a data chunk that has been replicated by employing geographically distributed (GEO) erasure coding is reduced. In one aspect, if a data chunk is to be deleted, partial coding chunks are generated by a source zone and provided to destination zones that store complete coding chunks for updating the complete coding chunks based on combining them with the received partial coding chunks. In another aspect, if a first data chunk is to be deleted and a second data chunk is to be replicated, partial coding chunks are generated by the source zone for each data chunk. Further, the partial coding chunks created for different data chunks can be combined to generate transforming chunks, which can then be transferred to the destination zones. The destination zones can then update the complete coding chunks based on combining them with the received transforming chunks.

8 Claims, 16 Drawing Sheets

(56) References Cited

U.S. PATENT DOCUMENTS

| | | | |
|---|---|---|---|
| 2014/0115182 A1* | 4/2014 | Sabaa | H04L 67/1097 709/232 |
| 2014/0281804 A1* | 9/2014 | Resch | G06F 8/65 714/763 |
| 2015/0074065 A1* | 3/2015 | Christ | G06F 3/067 707/692 |
| 2015/0112951 A1* | 4/2015 | Narayanamurthy | G06F 16/172 707/694 |
| 2015/0178007 A1* | 6/2015 | Moisa | G06F 16/156 713/190 |
| 2015/0186043 A1* | 7/2015 | Kesselman | G06F 3/0614 711/162 |
| 2017/0017671 A1* | 1/2017 | Baptist | H04L 67/1097 |
| 2017/0031945 A1* | 2/2017 | Sarab | G06F 16/1748 |
| 2018/0267985 A1* | 9/2018 | Badey | G06F 16/128 |

* cited by examiner

HANDLING DELETES WITH DISTRIBUTED ERASURE CODING

TECHNICAL FIELD

The subject disclosure relates generally to distributed erasure coding. More specifically, this disclosure relates to handling deletes with distributed erasure coding.

BACKGROUND

The large increase in amount of data generated by digital systems has created a new set of challenges for data storage environments. Traditional storage area network (SAN) and/or network-attached storage (NAS) architectures have not been designed to support data storage and/or protection at large multi-petabyte capacity levels. Object storage technology can be utilized to meet these requirements. By utilizing object storage technology, organizations can not only keep up with rising capacity levels, but can also store these new capacity levels at a manageable cost point.

Typically, a scale-out, cluster-based, shared-nothing object storage that employs a microservices architecture pattern, for example, an Elastic Cloud Storage (ECS) can be utilized as a storage environment for a new generation of workloads. ECS utilizes the latest trends in software architecture and development to achieve increased availability, capacity use efficiency, and performance. ECS uses a specific method for disk capacity management, wherein disk space is partitioned into a set of blocks of fixed size called chunks. User data is stored in these chunks and the chunks are shared. One chunk can contain fragments of several user objects. Chunk content is modified in an append mode. When chunks become full, they are sealed and the content of sealed chunks is immutable.

A corresponding feature of ECS supports geographically distributed setups (GEO) comprising two or more zones. When three or more zones are employed, each zone can receive chunks from other zones and the zones can then combine the chunks. This type of cluster-based storage of several racks supports cluster nodes that communicate with each other. One cluster can be located in a local data center and another cluster can be located in a remote data center. Although the geographically distributed setups can be used to provide an additional protection of user data by means of replication, the replication mechanism works at the chunks level.

The above-described background relating to ECS is merely intended to provide a contextual overview of some current issues, and is not intended to be exhaustive. Other contextual information may become further apparent upon review of the following detailed description.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its sole purpose is to present some concepts of the specification in a simplified form as a prelude to the more detailed description that is presented in this disclosure.

Example systems and methods, and other embodiments, disclosed herein relate to facilitating distributed erasure coding to load balance between different geographical zones of a distributed storage system and reduce inter-zone network traffic. In one example embodiment, a system is disclosed that comprises a processor and a memory that stores executable instructions that, when executed by the processor, facilitate performance of operations. Moreover, the operations comprise in response to determining that a data chunk stored within a first zone of a geographically distributed storage system is to be deleted, determining a group of partial coding chunks associated with the data chunk. Further, the operations comprise determining a second zone of the geographically distributed storage system that stores a complete coding chunk associated with the data chunk, wherein the complete coding chunk is determined based on erasure coding the data chunk. Furthermore, the operations comprise directing, to the second zone, a partial coding chunk of the group of partial coding chunks to facilitate a modification of the complete coding chunk, wherein the modification results in a removal of information related to the data chunk from the complete coding chunk.

Another example embodiment of the specification relates to a method that comprises in response to determining that a set of data chunks stored within a first zone of a geographically distributed storage system are to be modified, determining, by a system comprising a processor, coding information associated with a data chunk of the set of data chunks, wherein the determining the coding information is based on defined coding matrix data. According to an aspect, the method further comprises determining a second zone of the geographically distributed storage system that stores a coding chunk associated with the data chunk, wherein the coding chunk has been determined based on an erasure coding operation associated with the data chunk; and directing, to the second zone, a portion of the coding information to facilitate a modification of the coding chunk, wherein the modification results in a removal of information related to the data chunk from the coding chunk.

Another example embodiment of the specification relates to a computer-readable storage medium comprising instructions that, in response to execution, cause a computing node device comprising a processor to perform operations, comprising in response to determining that a first data chunk stored within a first zone of a geographically distributed storage system is to be deleted and a second data chunk stored within the first zone is to be replicated using distributed erasure coding, determining, based on defined coding matrix data, coding information associated with the first data chunk and the second data chunk; determining a second zone of the geographically distributed storage system that stores a coding chunk associated with the first data chunk, wherein the coding chunk has been determined based on a distributed erasure coding operation associated with the first data chunk; and providing, to the second zone, a portion of the coding information to facilitate an adjustment of the coding chunk, wherein the adjustment results in a removal of first information related to the first data chunk from the coding chunk and addition of second information employable to recover the second data chunk during a failure.

The following description and the drawings set forth certain illustrative aspects of the specification. These aspects are indicative, however, of but a few of the various ways in which the principles of the specification may be employed. Other advantages and novel features of the specification will become apparent from the detailed description of the specification when considered in conjunction with the drawings.

DETAILED DESCRIPTION

Figure 1:
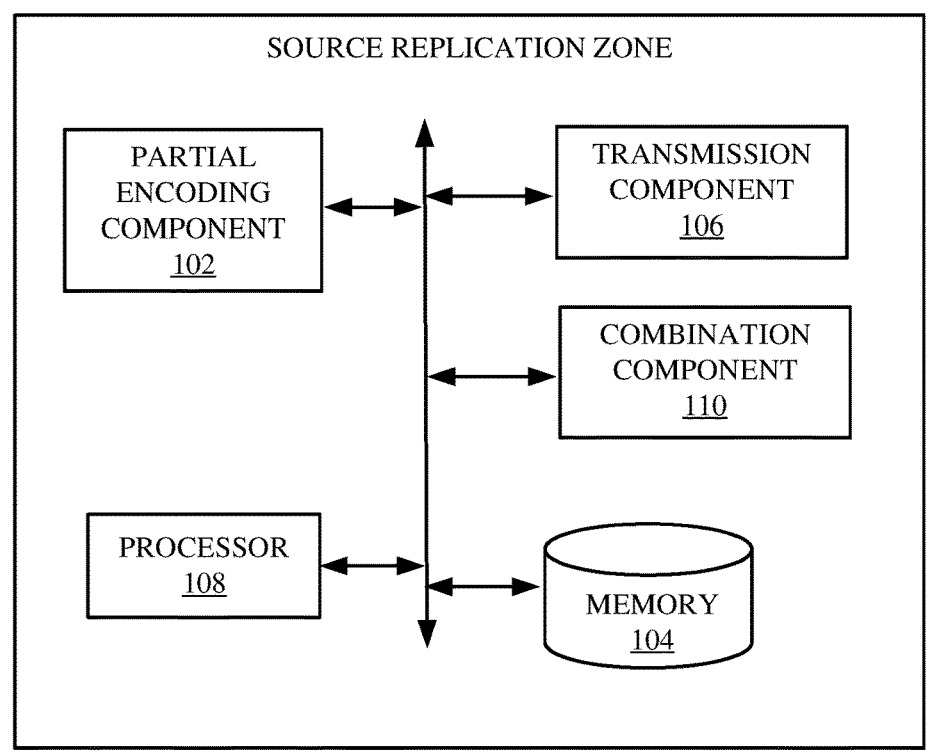
FIG. 1 illustrates an example source replication zone configured to delete data that has been replicated by employing distributed erasure coding.

One or more embodiments are now described with reference to the drawings, wherein like reference numerals are used to refer to like elements throughout. In the following description, for purposes of explanation, numerous specific details are set forth in order to provide a thorough understanding of the various embodiments. It may be evident, however, that the various embodiments can be practiced without these specific details, e.g., without applying to any particular networked environment or standard. In other instances, well-known structures and devices are shown in block diagram form in order to facilitate describing the embodiments in additional detail.

The term "cloud" as used herein can refer to a cluster of nodes (e.g., set of network servers), for example, within a distributed object storage system, that are communicatively and/or operatively coupled to each other, and that host a set of applications utilized for servicing user requests. In general, the cloud computing resources can communicate with user devices via most any wired and/or wireless communication network to provide access to services that are based in the cloud and not stored locally (e.g., on the user device). A typical cloud-computing environment can include multiple layers, aggregated together, that interact with each other to provide resources for end-users.

Example systems and methods disclosed herein, in one or more embodiments, relate to an elastic cloud storage (ECS) platform that can combine the cost advantages of commodity infrastructure with the reliability, availability and serviceability of traditional arrays. In one aspect, the ECS platform can comprise a cluster of nodes (also referred to as "cluster" herein) that delivers scalable and simple public cloud services with the reliability and/or control of a private-cloud infrastructure. Moreover, the ECS platform comprises a scale-out, cluster-based, shared-nothing object storage, which employs a microservices architecture pattern. The ECS platform can support storage, manipulation, and/or analysis of unstructured data on a massive scale on commodity hardware. As an example, ECS can support mobile, cloud, big data, and/or social networking applications. ECS can be deployed as a turnkey storage appliance or as a software product that can be installed on a set of qualified commodity servers and/or disks. The ECS scale-out and geo-distributed architecture is a cloud platform that can provide at least the following features: (i) lower cost than public clouds; (ii) unmatched combination of storage efficiency and data access; (iii) anywhere read/write access with strong consistency that simplifies application development; (iv) no single point of failure to increase availability and performance; (v) universal accessibility that eliminates storage silos and inefficient extract, transform, load (ETL)/data movement processes; etc. In an aspect, ECS does not rely on a file system for disk capacity management. Instead, ECS partitions disk space into a set of blocks of fixed size called chunks (e.g., having a chunk size of 128 MB). All user data is stored in these chunks and the chunks are shared. Typically, a chunk can comprise fragments of several different user objects. The chunk content can be modified in append-only mode. When a chunk becomes full, it can be sealed and content of a sealed chunk is immutable.

ECS does not employ traditional data protection schemes like mirroring or parity protection. Instead, ECS utilizes erasure coding for data protection. Although the systems and methods disclosed herein have been described with respect to object storage systems (e.g., ECS), it is noted that the subject specification is not limited to object storage systems and can be utilized for most any geo-distributed storage systems that utilize erasure coding for data protection.

Example systems and methods disclosed herein, in one or more embodiments, relate to geographically distributed (GEO) erasure coding, which inherits all the issues of GEO XOR except low scalability. Typically, organizations protect against outages or information loss by backing-up (e.g., replicating) their data periodically. During backup, one or more duplicate or deduplicated copies of the primary data are created and written to a new disk or to a tape. For disaster recovery purposes, a backup copy needs to be transported or replicated offsite to ensure the data is safe in the event of a disaster. A single point of failure is a risk of data loss and/or system unavailability. A single device, building, metropolitan area, power grid, natural disaster zone (e.g., flood zone, earthquake zone, hurricane zone, etc.), accident/attack zone (e.g., malicious attack) can represent a single point of failure. Redundancy and the distance that spans those points of failure can enable disaster recovery to keep the organizations operating smoothly regardless of the cause of the unplanned outage. In some scenarios, ECS can utilize an XOR technique to minimize capacity overhead associated with GEO data protection. However, the XOR technique is not scalable and the use of GEO XOR can enable a distributed storage to recover data from a failure of only a single zone and/or cluster and/or chunk in the distributed storage. However, GEO XOR cannot be utilized to recover data from a dual failure or from more complicated failures. To recover data from dual (and/or multiple) zone outage/failure GEO erasure coding can be utilized, wherein data can be replicated on storage devices deployed at different physical locations (e.g., at geographically separated zones/sites around the world).

Erasure coding was created as a forward error correction method for binary erasure channel. However, erasure coding can be used for data protection on data storages. During erasure coding, a piece of data can be divided into k data fragments of equal size. During encoding, redundant m coding fragments are created so that the system can tolerate the loss of any m fragments. The process of coding fragments creation is called encoding. The process of data fragments recovery using available data and coding fragments is called decoding.

If a distributed storage is to tolerate the loss of any m zones/clusters/chunks, then GEO erasure coding can begin at each zone by replicating each new chunk to at least m remote zones (e.g., m is most any integer greater than 1). As a result, there are m backup copies of each chunk. Typically, there is one primary backup copy, which can be utilized for encoding. Encoding is performed by one zone for primary backup chunks and other zones replicate to it. Once a zone has k primary chunks replicated from different remote zones, the zone can perform encoding using the chunks replicated to it as data fragments (e.g., wherein k is most any integer, typically greater than 1). The chunk size is fixed, in ECS, with padding or other data to complement, wherein the other data is added as needed. The result of encoding is m data portions of a chunk size. They are stored as chunks of a specific type called coding chunks. After encoding is complete, the zone can store one coding chunk locally and move other m−1 coding chunks to remote zones making sure all the k+m data and coding chunks are stored at different zones whenever possible. Afterwards, the primary backup chunks used for encoding and their peer backup chunks at other zones can be deleted.

In a geographically distributed data storage system, chunks from frontend storage devices (e.g., within frontend zones) can be replicated on a backend storage device (e.g., within backend zones). As an example, frontend storage devices can comprise storage devices that are generally designated, configured, etc., explicitly as a user-facing storage device that can create chunks from received user data, while backend storage devices can comprise storage devices that are generally designated, configured, etc., explicitly as non-user-facing storage devices that store chunks from front-end devices but that typically don't receive user data to create new chunks. Generally, a frontend storage device and a backend storage device are not interchangeable without re-configuration to an operator designated frontend or backend data storage role.

In some embodiments, a load for backend zones and/or inter-zone network traffic can be reduced by performing the encoding in two phases, wherein each phase can be distributed between the geographical zones. Further, the coding chunks can be generated in a distributed manner by their target home zones. This eliminates inter-zone network traffic that is traditionally produced during coding fragment distribution between zones during initial replication. Data chunk deletion requires repeated replication of chunk data to m remote zones. Systems and methods disclosed herein, in one or more non-limiting aspects, further reduce inter-zone network traffic during data deletion.

Referring initially to FIG. 1, there illustrated is an example source replication zone 100 configured to delete data that has been replicated by employing distributed erasure coding. As an example, a source replication zone 100 can comprise a frontend zone that comprises one or more nodes that can accept storage requests from storage clients and can store data chunks within memory 104. In the embodiment shown in FIG. 1, the source replication zone 100 can comprise a partial encoding component 102 that can generate a portion of an encoding operation utilized during erasure coding. For example, the encoding operation can be represented with the equation below:

$$C_i = \sum_{j=1}^{k} C_{i,j} \qquad (1)$$

wherein, $$C_{i,j} = X_{i,j} * D_j \qquad (2)$$

and wherein, $X_{i,j}$ is a defined coefficient from a coding matrix (e.g., wherein i, j, and/or k can be most any integer). Further, $D_j$ are independent data chunks and $C_i$ are coding chunks. All data/coding chunks united in one protection set are stored in different zones. According to an embodiment, the partial encoding component 102 can determine a set of partial coding chunks $C_{i,j}$ for data chunks $D_j$ that are stored within the source replication zone 100 (e.g., within memory 104). Moreover, a partial coding chunk is a chunk that is generated by executing a first phase of an encoding operation on a data chunk. This first phase of the encoding operation can be performed in parallel (e.g., simultaneously and/or substantially simultaneously) by different source replication zones. Since, $D_j$ is stored in locally and $X_{i,j}$ is a defined coefficient (e.g., stored within memory 104), the first phase does not utilize inter-zone network traffic/communication.

During replication for data protection, a transmission component 106 can replicate m partial coding chunks ($C_{i,j}$) (e.g., generated by the partial encoding component 102) to destination zones (e.g., remote/backend zones). In one aspect, all partial coding chunks of one finished/complete coding chunk are to be replicated to one destination zone. In an example scenario, wherein m backend zones are utilized, the backend zones can be ordered by an identifier (e.g., name, serial number, etc.) such that chunks $C_{1,j}$ are replicated to a first destination replication zone, chunks $C_{2,j}$ are replicated to a second destination replication zone, and so on. After replication, the partial coding chunks can be deleted from memory 104. It should be noted that replicating the partial coding chunks can occur by copying the partial coding chunks at their respective zones and then sending a copied data chunk to a destination replication zone (e.g., backend zone), or the destination replication zone can be in bi-directional communication with a first zone, wherein a copy of the partial coding chunk of the first zone is created remotely at the destination replication zone.

According to an aspect, subsequent to data protection, during deletion of a data chunk, the partial encoding component 102 can re-generate the partial coding chunks $C_{i,j}$ (e.g., by employing equations (1) and (2)) for a data chunk that is to be deleted. The transmission component 106 can replicate the partial coding chunks $C_{i,j}$ to a destination replication zone that stores a complete coding chunk corresponding to the to-be-deleted data chunk. Moreover, a location of coding chunks for a data chunk that is to be deleted is known and thus, destination zones for repeated replication of the data chunk to be deleted are also known. Each replication destination zone can perform the second phase of un-encoding EC operation, wherein each replication destination zone produces an updated coding chunk $C_i$ via combination (e.g., subtraction) of a partial coding chunk it received ($C_{i,j}$) from a complete coding chunk the zone contains ($C_i$). The result of subtraction is stored locally at the replication destination zone.

It is noted that ECS system can utilize Galois Field arithmetic where summation and/or subtraction operations can be replaced with XOR operation. Then, with the two-phase encoding and un-encoding operations disclosed herein, replication destination zones can XOR (and "un-XOR") partial coding chunks they receive from zones with data chunks. That is, each replication destination zone works as if GEO XOR was used. However, it is noted that GEO EC is different from GEO XOR at the system level. Moreover, replication destination zones implement the second phase of encoding and un-encoding operation, which is basic XOR, independently (e.g., without communicating with and/or exchanging information with another replication destination zone).

According to another aspect, during an operation that deletes a data chunk stored within memory 104 and protects a new data chunk to memory 104, the partial encoding component 102 can re-generate partial coding chunks $C_{i,j}$ (e.g., by employing equations (1) and (2)) for the data chunk to be deleted and the new data chunk. A combination component 110 can combine the partial coding chunks to generate m transforming chunks. For example, one partial coding chunk for a to-be-deleted data chunk and one partial coding chunk for a new chunk can be combined (e.g., added or XORed). The transmission component 106 can replicate the transforming coding chunks to a replication destination zone (e.g., backend zone) that stores a complete coding chunk for the to-be-deleted data chunk. Each replication destination zone combines (XORs) the coding chunk it stores with the transforming chunk to generate a new coding chunk that does not comprise information about the to-be-deleted chunk but comprises all the necessary data for protection of the new data chunk.

Aspects of the processor 108 can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described herein. In an aspect, memory 104 can store computer executable components and instructions. It is noted that the memory 104 can comprise volatile memory(s) or nonvolatile memory(s), or can comprise both volatile and nonvolatile memory(s). Examples of suitable types of volatile and non-volatile memory are described below with reference to FIG. 16. The memory (e.g., data stores, databases) of the subject systems and methods is intended to comprise, without being limited to, these and any other suitable types of memory. In one example, source replication zone 100 can be part of most any object storage system such as, but not limited to, Dell EMC® Elastic Cloud Storage (ECS™).

Figure 2:
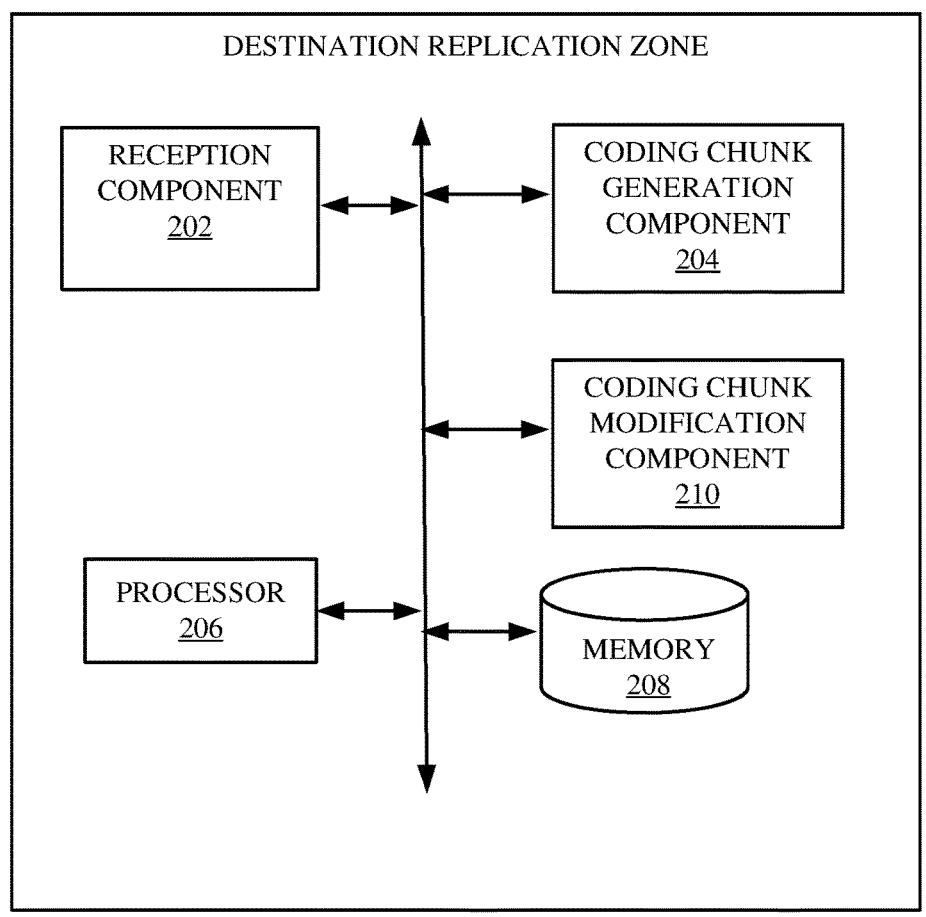
FIG. 2 illustrates an example destination replication zone configured to update coding data generated during distributed erasure coding in response to determining that a data chunk is to be deleted.

FIG. 2 illustrates an example destination replication zone 200 configured to update coding data generated during distributed erasure coding in response to determining that a data chunk associated with the coding data is to be deleted. As an example, the destination replication zone 200 can comprise a backend zone that comprises one or more nodes utilized as replication targets/destinations for the source replication zones (e.g., frontend zones). Moreover, the destination replication zone 200 can be utilized to produce and store coding chunks for all the data chunks produced by the source replication zones. In the embodiment shown in FIG. 2, the destination replication zone 200 can comprise a reception component 202 that can receive partial coding chunks from source replication zones (e.g., source replication zone 100) during initial data protection. A coding chunk generation component 204 can be utilized to combine (e.g., add) the partial coding chunks to generate a complete coding chunk. In one aspect, different destination replication zones can generate respective coding chunks $C_i$ simultaneously or in parallel. As an example, $C_i$ is a sum of $C_{i,j}$ provided by the source replication zones. The result of the sum is stored locally (e.g., to memory 208) as a complete/finished coding chunk $C_i$. This is the final phase of encoding. After all the complete/finished coding chunks are stored in memory 208, the source partial coding chunks can be deleted from memory 104.

According to an aspect, during deletion of a data chunk stored within a source replication zone (e.g., source replication zone 100), the source replication zone can re-generate partial coding chunks from the data chunk that is to be deleted and the reception component 202 can receive a partial coding chunk from the source replication zone. A coding chunk modification component 210 can perform a second phase of un-encoding EC operation, wherein each the coding chunk modification component 210 can combine (e.g., subtract) the partial coding chunk ($C_{i,j}$) from a complete coding chunk ($C_i$) stored within memory 208. The result of combination can be stored within memory 208.

According to another aspect, during an operation that deletes a data chunk stored within a source replication zone (e.g., source replication zone 100) and adds a new data chunk to the source replication zone, the source replication zone can re-generate the partial coding chunks $C_{i,j}$ for the data chunk that is to be deleted and generate new partial coding chunks for the new data chunk. Further, m transforming chunks can be generated by combining the partial coding chunks. In an aspect, the reception component 202 can receive one of the transforming coding chunks and the coding chunk modification component 210 can combine (e.g., XOR) the coding chunk stored in memory 208 with the transforming chunk to generate a new coding chunk that does not comprise information about the to-be-deleted chunk but comprises all the necessary data for protection of the new data chunk. As an example, the new coding chunk can be stored in memory 208 and the coding chunk ($C_i$) can be deleted.

Aspects of the processor 206 can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described herein. In an aspect, memory 208 can store computer executable components and instructions. It is noted that the memory 208 can comprise volatile memory(s) or nonvolatile memory(s), or can comprise both volatile and nonvolatile memory(s). Examples of suitable types of volatile and non-volatile memory are described below with reference to FIG. 16. In one example, destination replication zone 200 can be part of most any object storage system such as, but not limited to, Dell EMC® Elastic Cloud Storage (ECS™).

Figure 3:
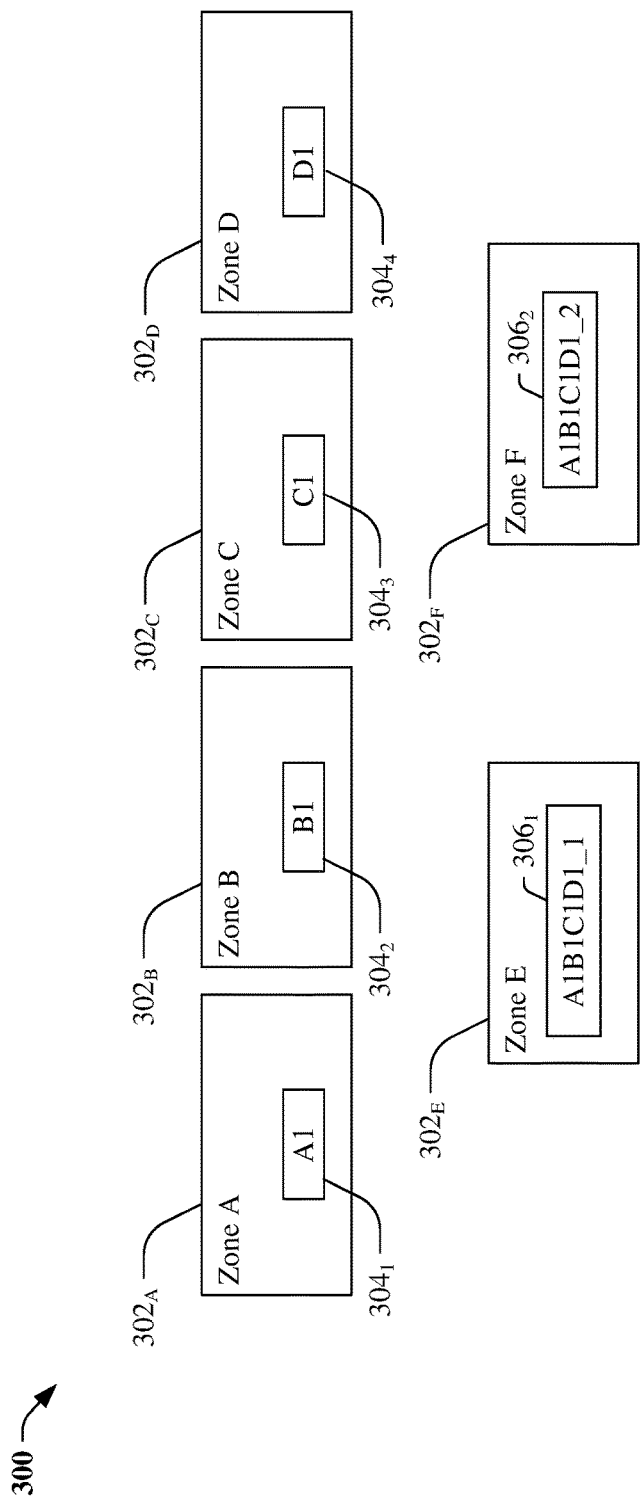
FIG. 3 illustrates an example system with data chunks that are protected with geographically distributed erasure coding.

Referring now to FIG. 3, there is illustrated an example system 300 comprising four data chunks protected with GEO distributed erasure coding. System 300 comprises six geographically distributed zones, zone A $302_A$, zone B $302_A$, zone C $302_C$, zone D $302_D$, zone E $302_E$, and zone F $302_F$. As an example, the zones A-F can be geographically dispersed systems that are linked via an inter-zone network (e.g., a wide area network (WAN)) to bi-directionally replicate data among the zones. The geo-replication ensures that the data is protected against site failures and disasters.

In one example layout, four data chunks, A1 $304_1$, B1 $304_2$, C1 $304_3$, and D1 $304_4$, can be stored to zone A $302_A$, zone B $302_A$, zone C $302_C$, and zone D $302_D$, respectively. In one aspect, zone A $302_A$, zone B $302_A$, zone C $302_C$, and/or zone D $302_D$ can be substantially similar to source replication zone 100 and can include functionality as more fully described herein, for example, as described above with regard to source replication zone 100. Further, zone E $302_E$ and zone F $302_F$ are typically utilized to store coding chunks utilized for data protection associated with the data chunks (D1-D4). In one aspect, coding chunks A1B1C1D1_1 ($306_1$) and A1B1C1D1_2 ($306_2$) stored within zone E $302_E$ and zone F $302_F$, respectively, can be determined based on a distributed EC operation, for example, utilizing 4+2 (k+m) erasure coding configuration. Typically, zone E $302_E$ and/or zone F $302_F$ can be substantially similar to destination replication zone 200 and can include functionality as more fully described herein, for example, as described above with regard to destination replication zone 200.

Figure 4:
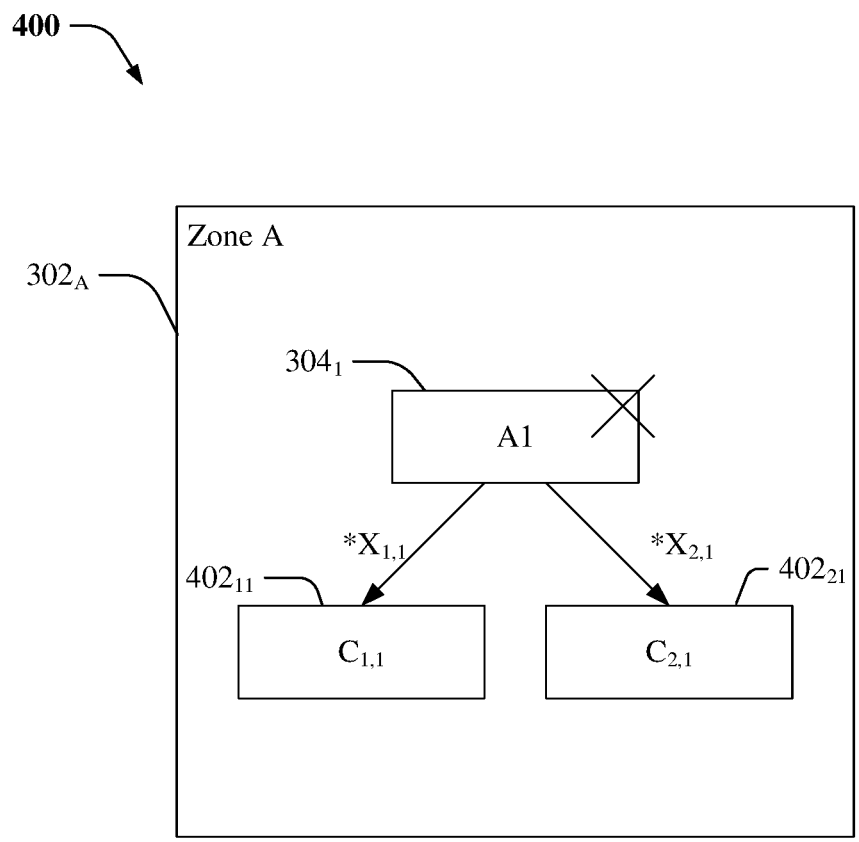
FIG. 4 illustrates an example system for creating partial coding chunks in response to determining that a data chunk is to be deleted.

FIGS. 4-7 depict a delete operation wherein a data chunk is to be deleted. Referring now to FIG. 4, there illustrated is an example system 400 for creating partial coding chunks in response to determining that a data chunk is to be deleted. In this example scenario, zone A $302_A$ can determine that data chunk A1 $304_1$ is to be deleted (e.g., based on instructions received from a client device (not shown)). According to an aspect, zone A $302_A$ can generate (e.g., via the partial encoding component 102) a set of partial coding chunks from the data chunk A1 $304_1$. As an example, a defined coding matrix can be utilized to determine coefficients $X_{i,j}$. The partial coding chunks, $C_{1,1}$ ($402_{11}$) and $C_{2,1}$ ($402_{21}$) can be determined by combining the data chunk, A1 $304_1$, with the corresponding coefficients. In one example, partial coding chunks ($C_{i,j}$) can be determined as follows:

$$C_{1,1} = A1 * X_{1,1} \quad (3)$$

$$C_{2,1} = A1 * X_{2,1} \quad (4)$$

Figure 5:
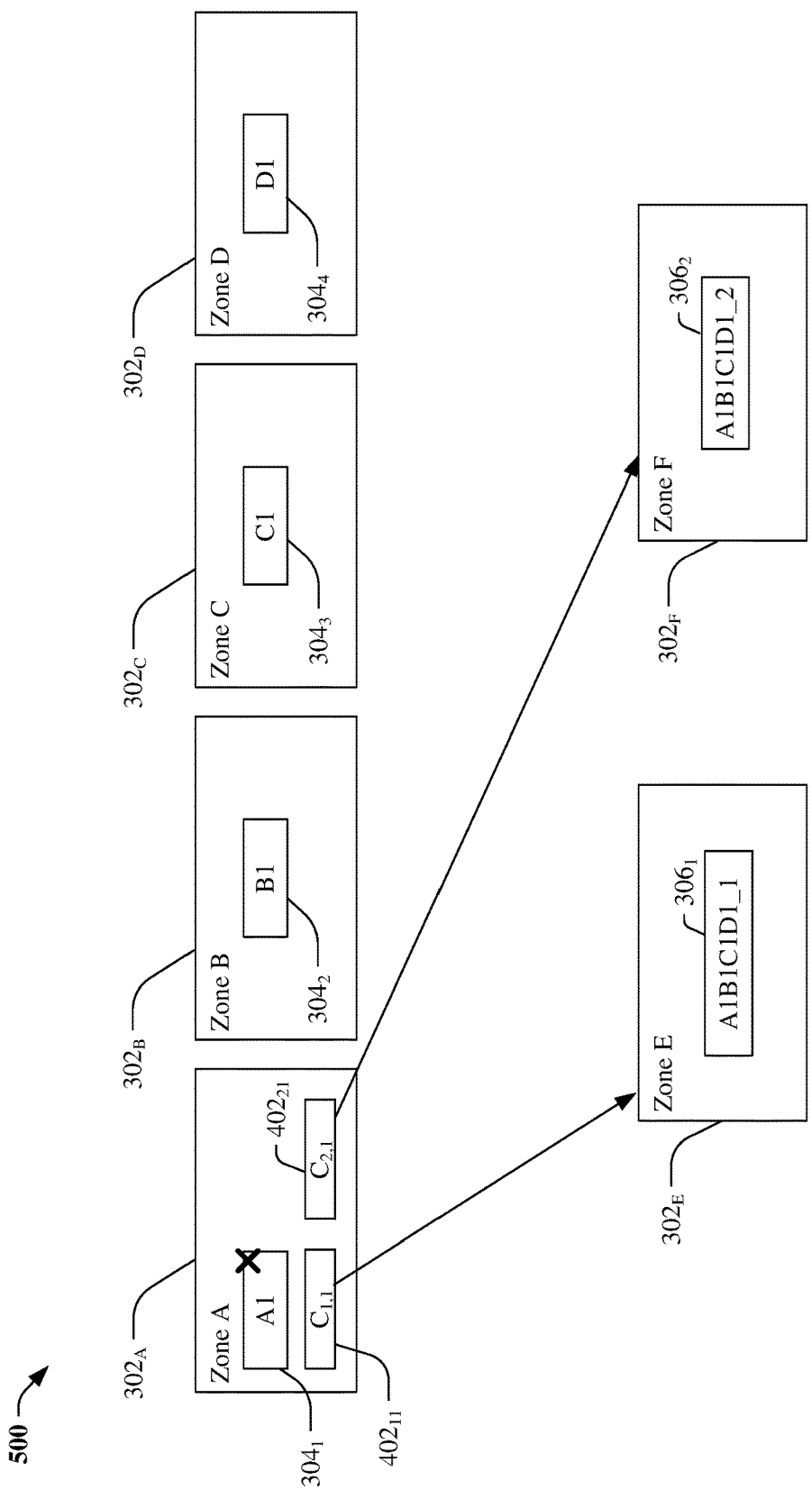
FIG. 5 illustrates an example system for transmission of partial coding chunks to a replication destination zone.

FIG. 5 illustrates a system 500 for transmission of partial coding chunks ($C_{i,j}$) to a replication destination zone. Moreover, the replication destination zone can be determined as a zone (e.g., backend zone) that stores a coding chunk associated with A1 $304_1$. In an aspect, zone A $302_A$ can transfer the partial coding chunks ($C_{i,j}$) to the remote zones E and F. For example, partial coding chunks $C_{1,1}$ ($402_{11}$) is transferred to zone E $302_E$ and partial coding chunks $C_{2,1}$ ($402_{21}$) is transferred to zone F $302_F$. In one aspect, zone A $302_A$ can create the partial coding chunks ($C_{i,j}$) as real chunks that are stored in the zone A $302_A$. Alternatively, in another aspect, zone A $302_A$ can transform a data chunk to the partial coding chunks (e.g., via multiplication) on the fly, for example, while streaming data to remote zones (E and/or F).

Figure 6:
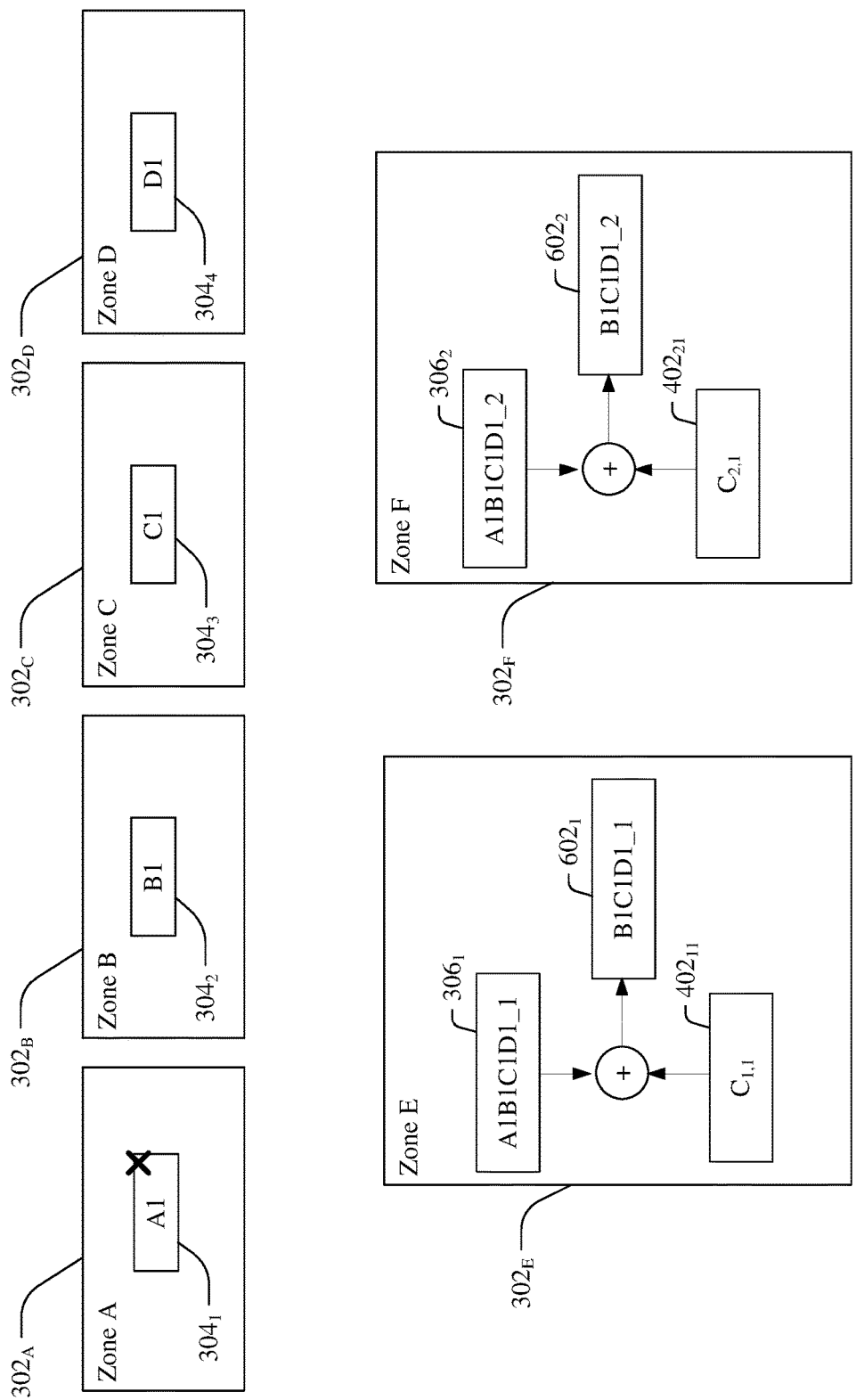
FIG. 6 illustrates an example system for updating coding chunks in response to determining that a data chunk associated with the coding chunk is to be deleted.

FIG. 6 illustrates an example system 600 for updating coding chunks in response to determining that a data chunk associated with the coding chunk is to be deleted. In one aspect, the remote zones receive the partial coding chunks generated from the data chunk A1 $304_1$. As described above, zone E $302_E$ can receive partial coding chunk $C_{1,1}$ $402_{11}$ and zone F $302_F$ can receive partial coding chunk $C_{2,1}$ $402_{21}$ from zone A $302_A$. According to an aspect, zone E $302_E$ can update coding chunk A1B1C1D1_1 $306_1$ based on combining (e.g., subtracting/XORing) partial coding chunk $C_{1,1}$ with the coding chunk A1B1C1D1_1 $306_1$. In another aspect, zone F $302_F$ can update coding chunk A1B1C1D1_2 $306_2$ based on combining (e.g., subtracting/XORing) partial coding chunk $C_{2,1}$ $402_{21}$ with the coding chunk A1B1C1D1_2 $306_2$. The combination results in updated coding chunks, B1C1D1_1 5021 and B1C1D1_2 5022, respectively, that do not comprise coding information related to data chunk A1 $304_1$. It is noted that since there are no primary backup copies of data chunks, each remote zone can update the coding chunk independently (e.g., without communicating with each other).

Figure 7:
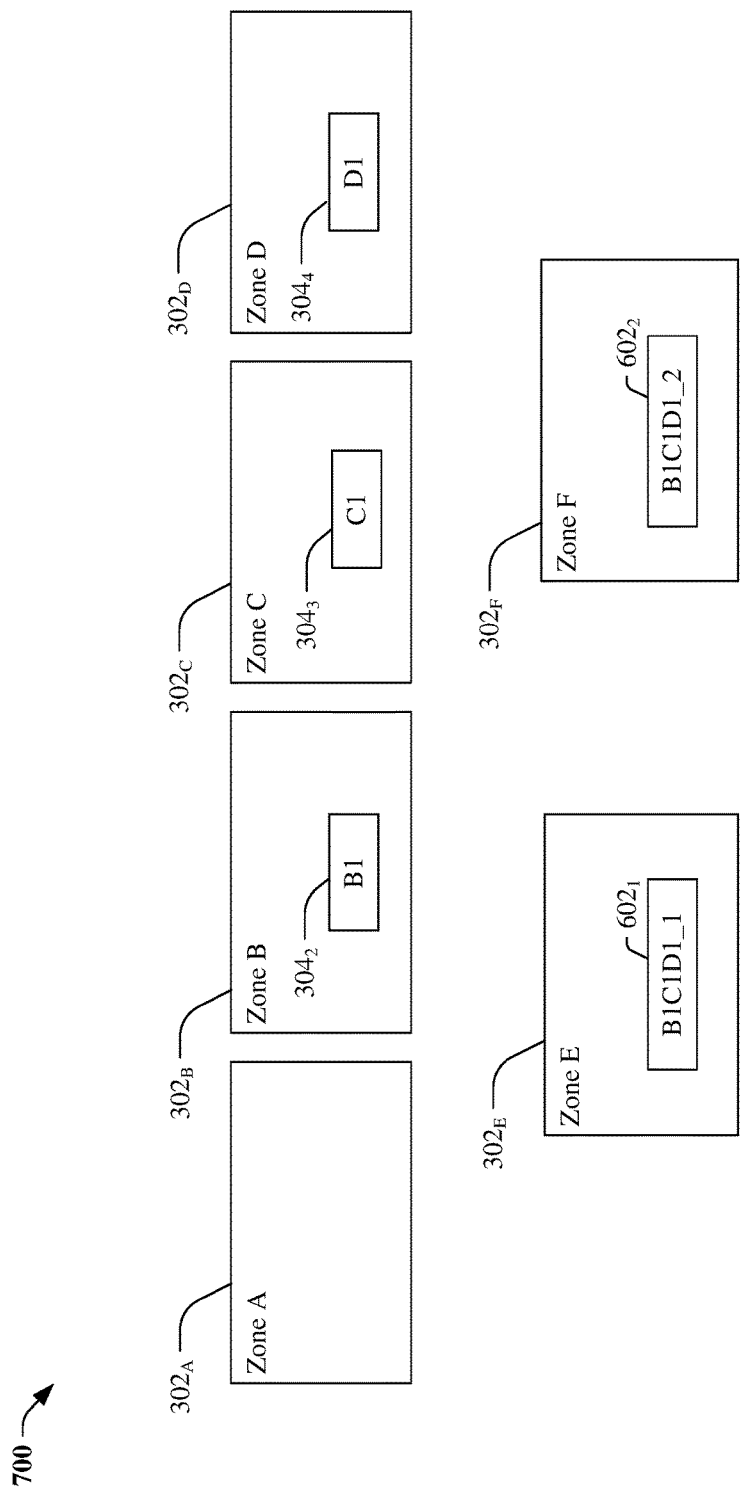
FIG. 7 illustrates an example system that depicts a data layout after a delete operation has been completed.

FIG. 7 illustrates an example system 700 that depicts a data layout after a delete operation has been completed. In an aspect, the partial coding chunks ($C_{1,1}$ $402_{11}$ and $C_{2,1}$ $402_{21}$) and the data chunk A1 $304_1$ can be deleted. Moreover, the updated coding chunks, B1C1D1_1 5021 and B1C1D1_2 5022, comprise information that can be utilized to recover one or more of the data chunks B1 $304_2$, C1 $304_3$, or D1 $304_4$, for example, in case of failure and/or outage. Decoding is an inverse operation for the above described distributed encoding mechanism. In one aspect, a decoding matrix can be utilized for decoding that is different from the coding matrix (e.g., the coefficients in the coding and decoding matrices are different). According to an aspect, on determining that one or more zones have failed and/or are unavailable, the remaining available zones can provide their chunk for decoding (e.g., during disaster recovery). For example, during a first phase of decoding, the available data chunks can be combined with (e.g., multiplied by) the corresponding coefficients of the decoding matrix to generate a set of partial data chunks, which can then be provided to one or more remote zones. During a second phase, the set of partial data chunks can be combined to recover the lost data chunk.

Figure 8:
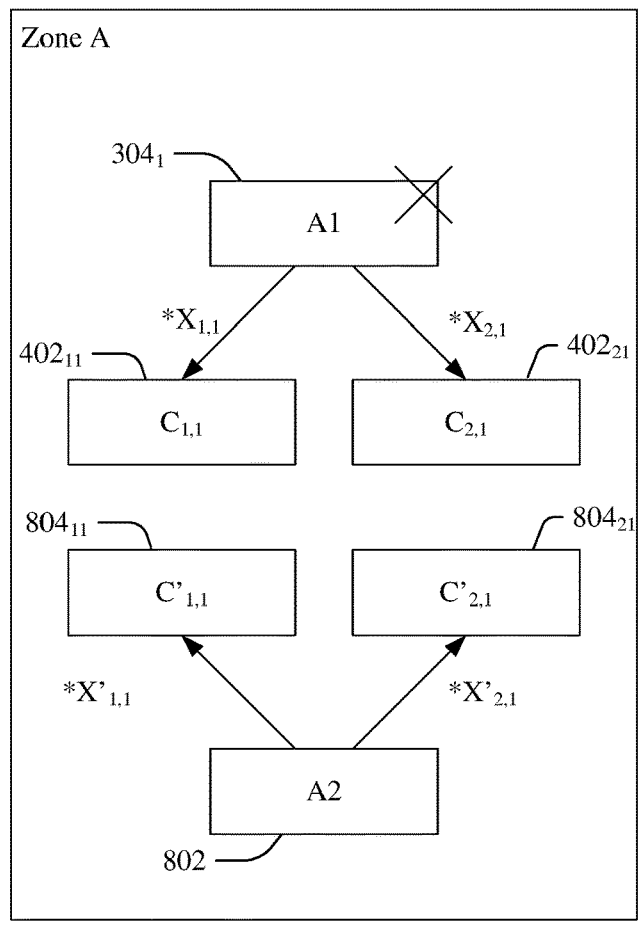
FIG. 8 illustrates an example system for creating partial coding chunks in response to determining that a first data chunk is to be deleted and a second data chunk is to be replicated.

FIGS. 8-12 depict an operation wherein a data chunk is to be deleted and a new data chunk is to be added to a zone. Referring now to FIG. 8, there illustrated is an example system 800 for creating partial coding chunks in response to determining that a first data chunk is to be deleted and a second data chunk is to be replicated (e.g., based on instructions received from a client device). In this example scenario, zone A $302_A$ can determine that data chunk A1 $304_1$ is to be deleted and data chunk A2 802 is to be replicated (for data protection). According to an aspect, zone A $302_A$ can generate (e.g., via partial encoding component 102) m (in this example scenario m=2) partial coding chunks from the data chunks A1 $304_1$ and A2 802. As an example, the defined coding matrix is utilized to determine coefficients $X_{i,j}$. The partial coding chunks, $C_{1,1}$ ($402_{11}$), $C_{2,1}$ ($402_{21}$), can be determined based on equations (3) and (4). Further, partial coding chunks, $C'_{1,1}$ ($804_{11}$), $C'_{2,1}$ ($804_{21}$) can be determined by combining the data chunk A2 802 with the corresponding coefficients as follows:

$$C'_{1,1} = A2 * X'_{1,1} \quad (5)$$

$$C'_{2,1} = A2 * X'_{2,1} \quad (6)$$

wherein $X'_{1,1}$ and $X'_{2,1}$ are defined coefficients.

Figure 9:
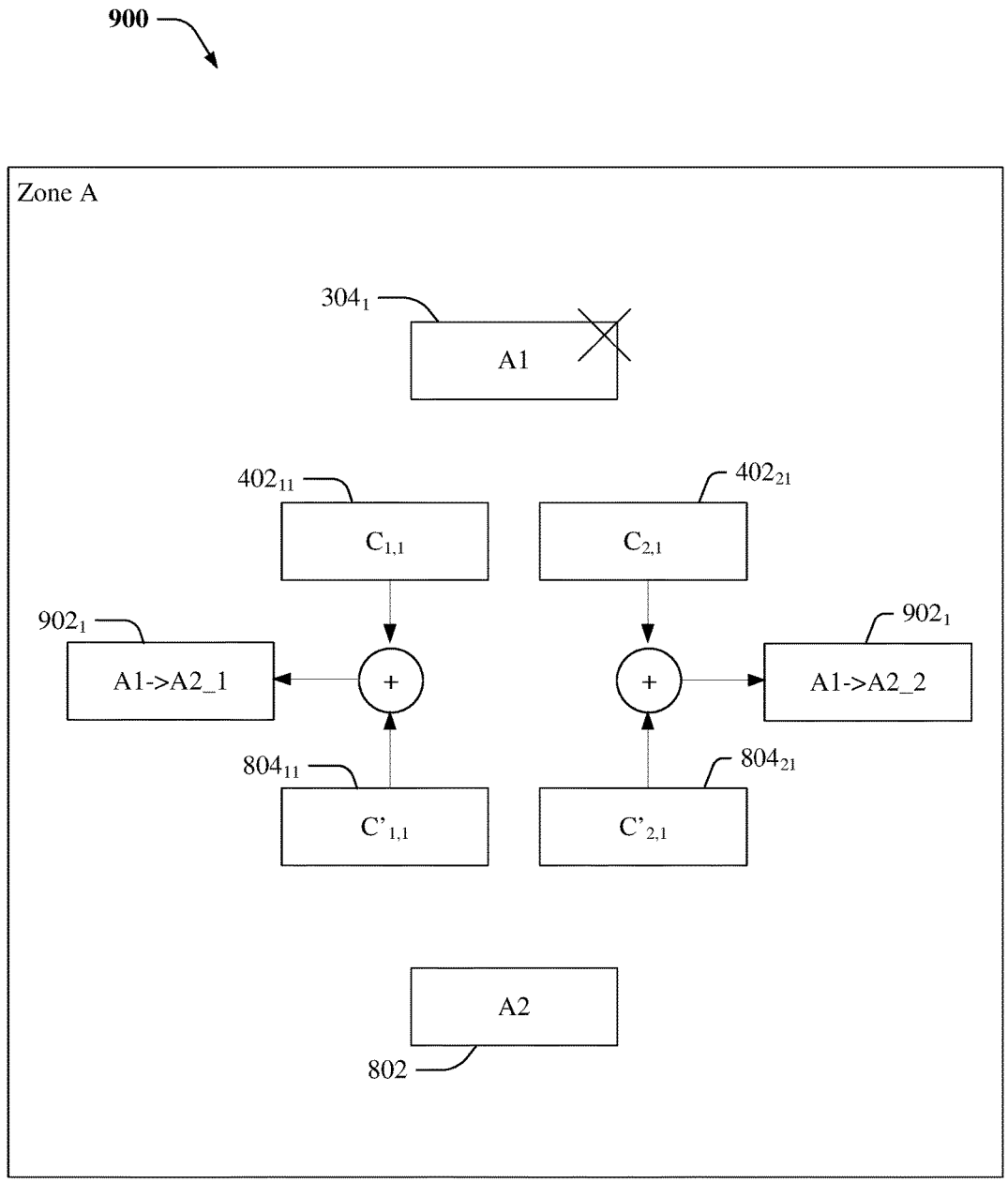
FIG. 9 illustrates an example system for determining transforming chunks in accordance with an aspect of the subject specification.

FIG. 9 illustrates a system 900 for determining transforming chunks. In an aspect, chunks A1 304$_1$ and A2 802 can be handled together. Moreover, zone A 302$_A$ can combine (e.g., XOR) corresponding pairs of the partial coding chunks to generate transforming chunks. For example, $C_{1,1}$ (402$_{11}$) can be combined with $C'_{1,1}$ (804$_{11}$) to generate transforming chunk A1→A2_1 902$_1$ and $C_{2,1}$ (402$_{21}$) can be combined with $C'_{2,1}$ (804$_{21}$) to generate transforming chunk A1→A2_2 902$_2$. It is noted that a transforming chunk does not combine a to-be-deleted data chunk and a new chunk, but instead combines partial coding chunks that are determined from the to-be-deleted data chunk and the new chunk. Moreover, a partial coding chunk for a to-be-deleted data chunk and a partial coding chunk for a new chunk can be combined. The replication source zone (e.g., zone A 302$_A$) produces m such transforming chunks and replicates the m transforming chunks to the remote zones that store the coding chunks for the to-be-deleted data chunk. Since the transforming chunk combines partial coding chunks that are determined from the to-be-deleted data chunk and the new chunk, the replication source zone would not need to replicate 2*m chunks (m for the old chunk and m for the new chunk). Thus, inter-zone network traffic can be reduced.

Figure 10:
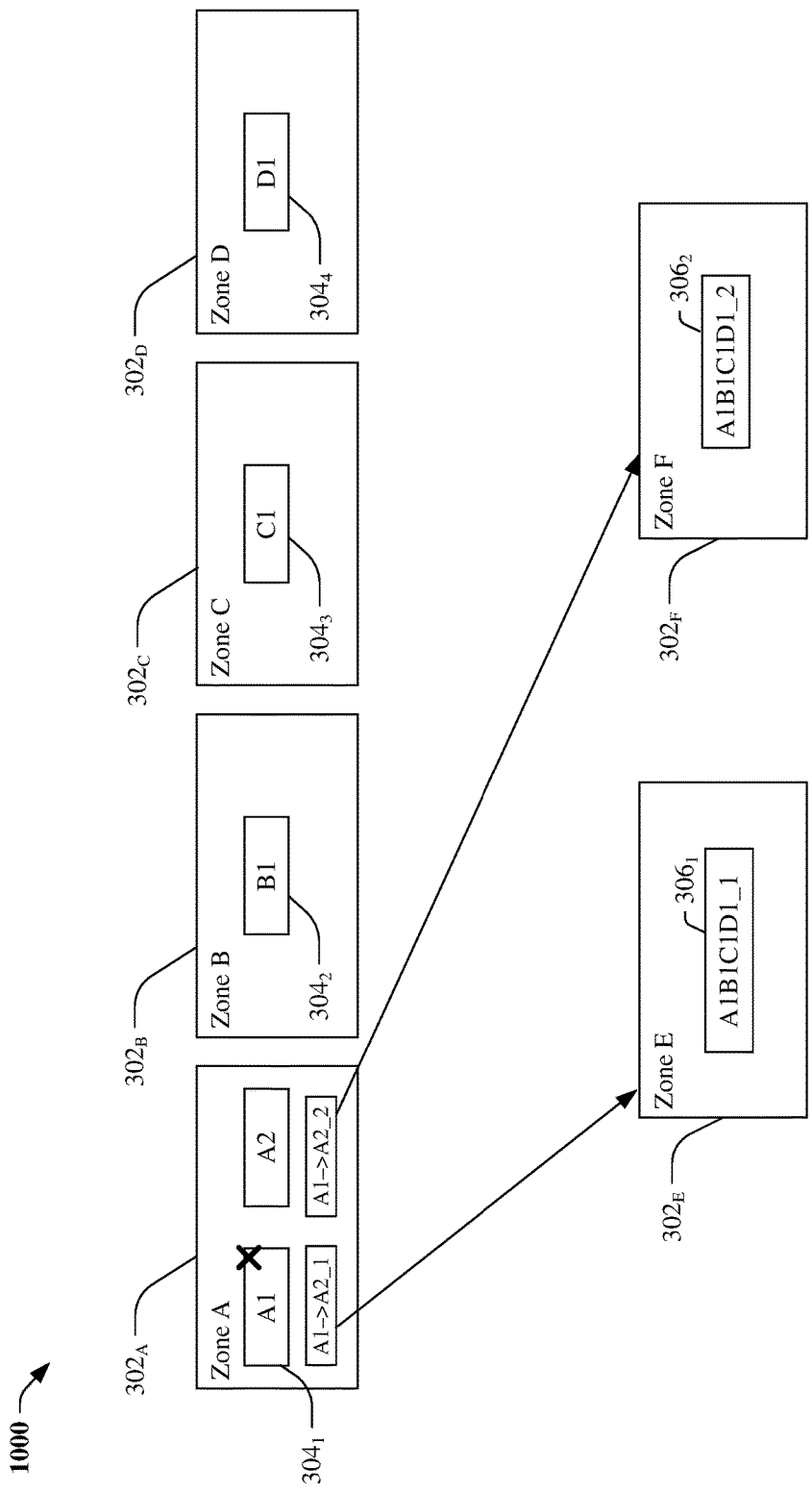
FIG. 10 illustrates an example system for a transmission of transforming chunks to a replication destination zone.

FIG. 10 illustrates a system 1000 for a transmission of transforming chunks to a replication destination zone. Moreover, the replication destination zone can be determined as a zone (e.g., backend zones) that stores a coding chunk associated with A1 304$_1$. In an aspect, zone A 302$_A$ can transfer the transforming chunks to the remote zones E and F. For example, A1→A2_1 902$_1$ can be transferred to zone E 302$_E$ and A1→A2_2 902$_2$ can be transferred to zone F 302$_F$. In one aspect, zone A 302$_A$ can create the transforming chunks as real chunks that are stored in the zone A 302$_A$. Alternatively, in another aspect, zone A 302$_A$ can transform a data chunk to the transforming chunks (e.g., via multiplication) on the fly, for example, while streaming data to remote zones (E and/or F).

Figure 11:
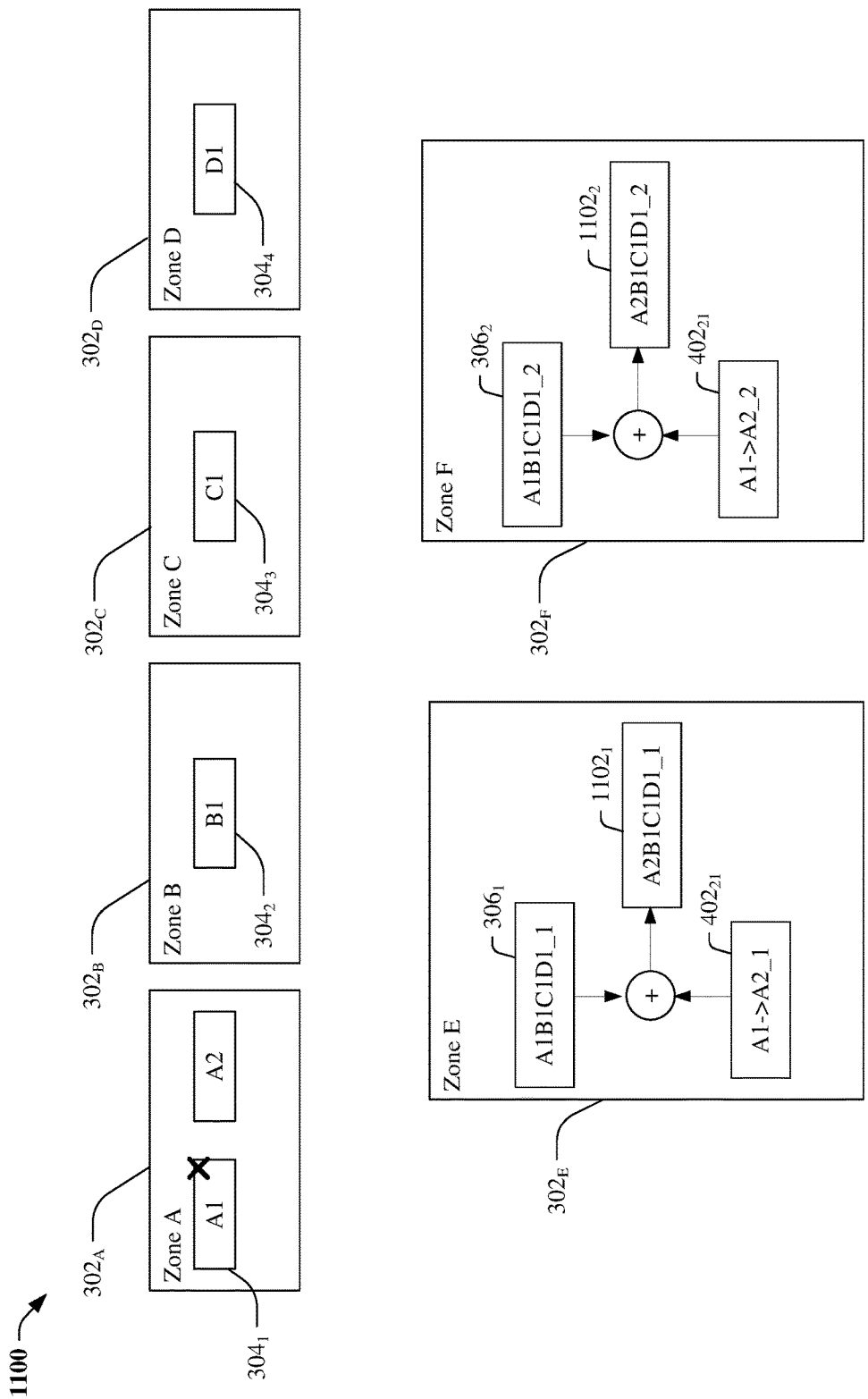
FIG. 11 illustrates an example system for updating coding chunks in response to determining that a data chunk associated with the coding chunk is to be deleted and a new data chunk is to be replicated.

FIG. 11 illustrates an example system 1100 for updating coding chunks in response to determining that a data chunk associated with the coding chunk is to be deleted and a new data chunk is to be replicated. In one aspect, the remote zones receive the transforming chunks generated from the data chunks. As described above, zone E 302$_E$ can receive transforming chunk A1→A2_1 902$_1$ and zone F 302$_F$ can receive transforming chunk A1→A2_2 902$_2$ from zone A 302$_A$. According to an aspect, zone E 302$_E$ can update coding chunk A1B1C1D1_1 306$_1$ based on combining (e.g., XORing) transforming chunk A1→A2_1 902$_1$ with the coding chunk A1B1C1D1_1 306$_1$. In another aspect, zone F 302$_F$ can update coding chunk A1B1C1D1_2 306$_2$ based on combining (e.g., XORing) transforming chunk A1→A2_2 902$_2$ with the coding chunk A1B1C1D1_2 306$_2$. The combination results in updated coding chunks, A2B1C1D1_1 1102$_1$ and A2B1C1D1_2 1102$_2$, that do not comprise coding information related to data chunk A1 304$_1$ but comprises the necessary data for recovery of data chunk A2 802 (e.g., in case of a data loss). It is noted that since there are no primary backup copies of data chunks, each remote zone can update the coding chunk independently (e.g., without communicating with each other).

Figure 12:
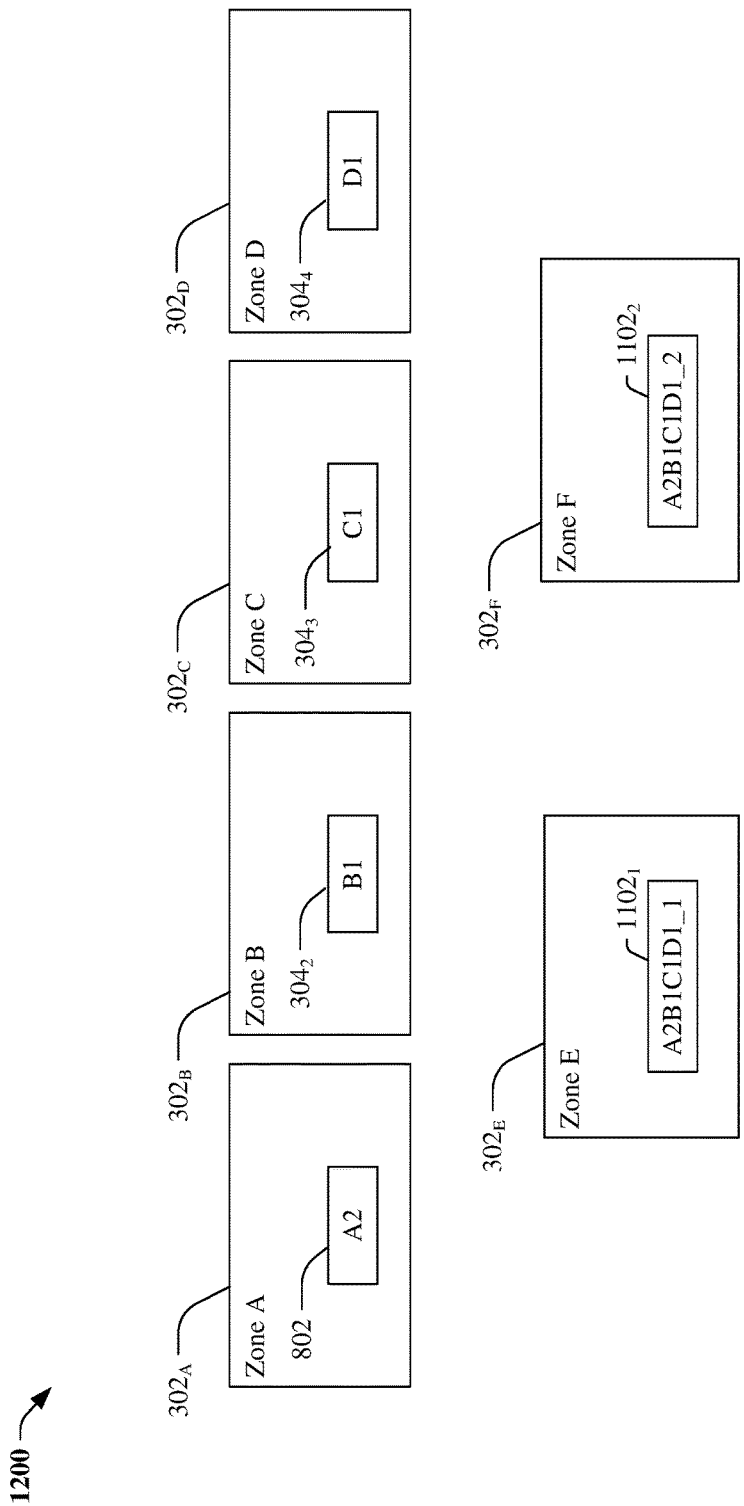
FIG. 12 illustrates an example system that depicts a data layout after a delete and replicate operation has been completed.

FIG. 12 illustrates an example system 1200 that depicts a data layout after a delete and replicate operation has been completed. In an aspect, the transforming chunks (A1→A2_1 902$_1$ and A1→A2_2 902$_2$) and the data chunk A1 304$_1$ can be deleted. Moreover, the updated coding chunks, A2B1C1D1_1 1102$_1$ and A2B1C1D1_2 1102$_2$, comprise information that can be utilized to recover, based on EC decoding, one or more of the data chunks A2 802, B1 304$_2$, C1 304$_3$, or D1 304$_4$, for example, in case of failure and/or outage.

Figure 13:
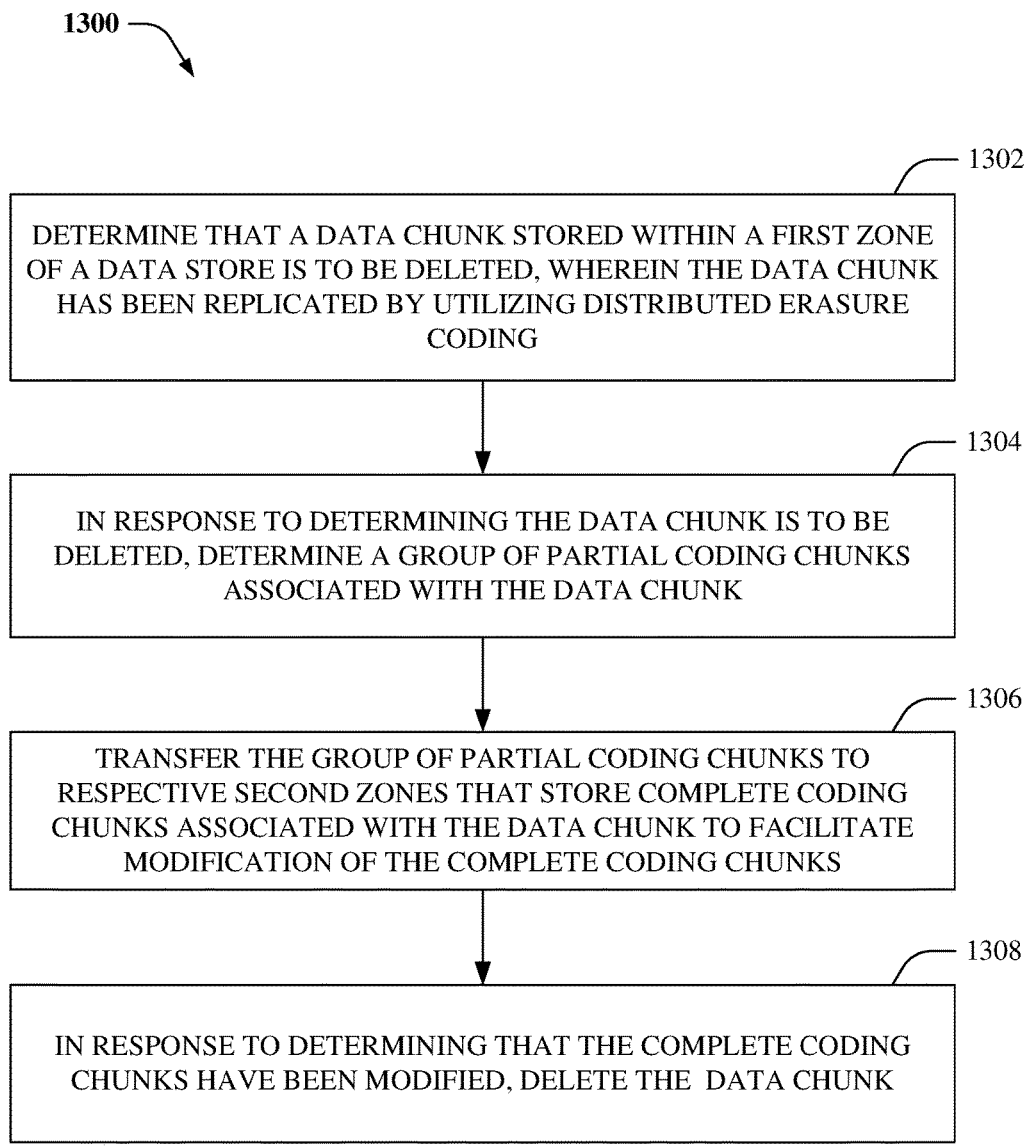
FIG. 13 illustrates an example method for updating coding chunks in response to determining that a data chunk is to be deleted.
Figure 14:
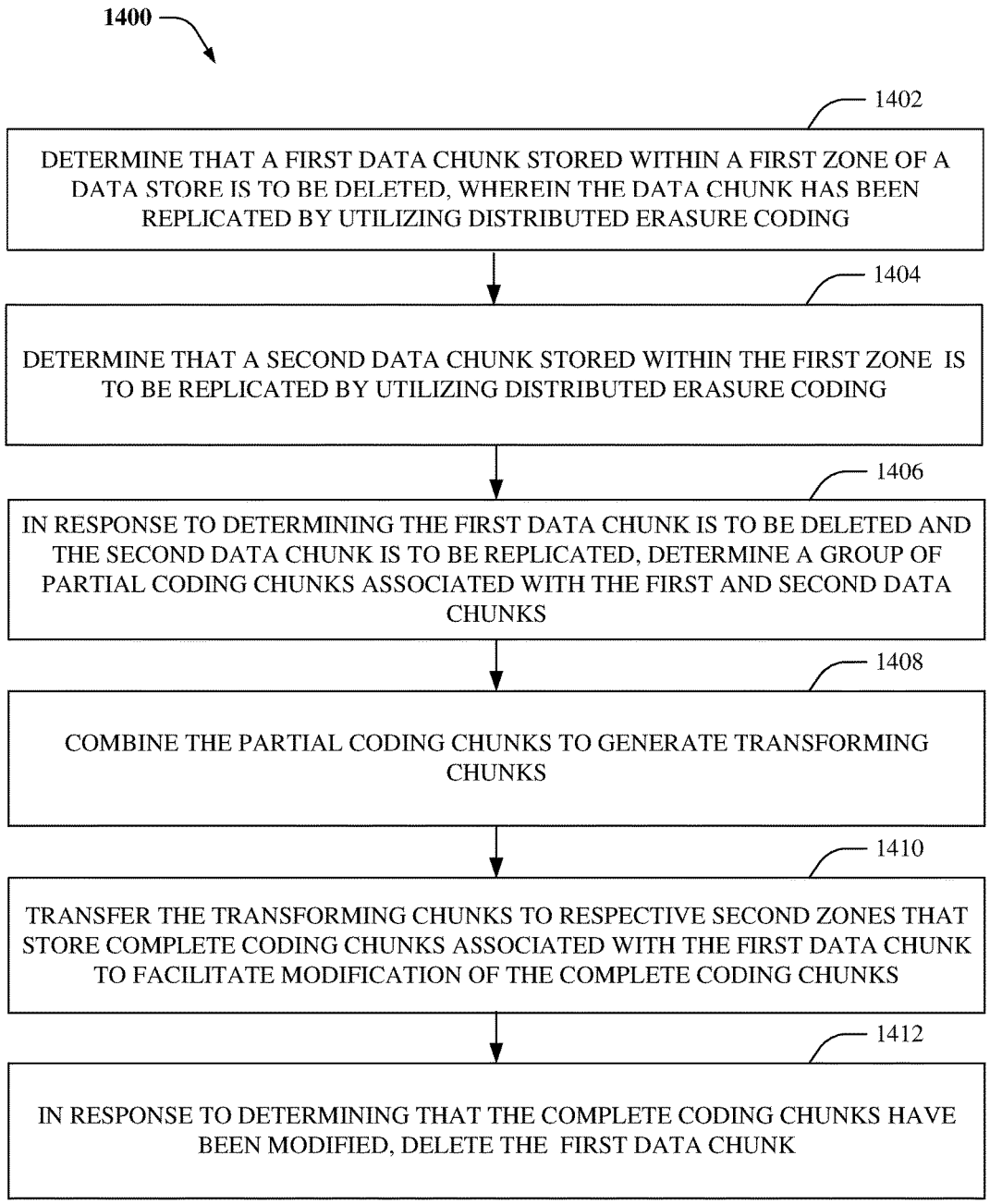
FIG. 14 illustrates an example method for updating coding chunks in response to determining that a first data chunk is to be deleted and a second data chunk is to be protected using distributed erasure coding.
Figure 15:
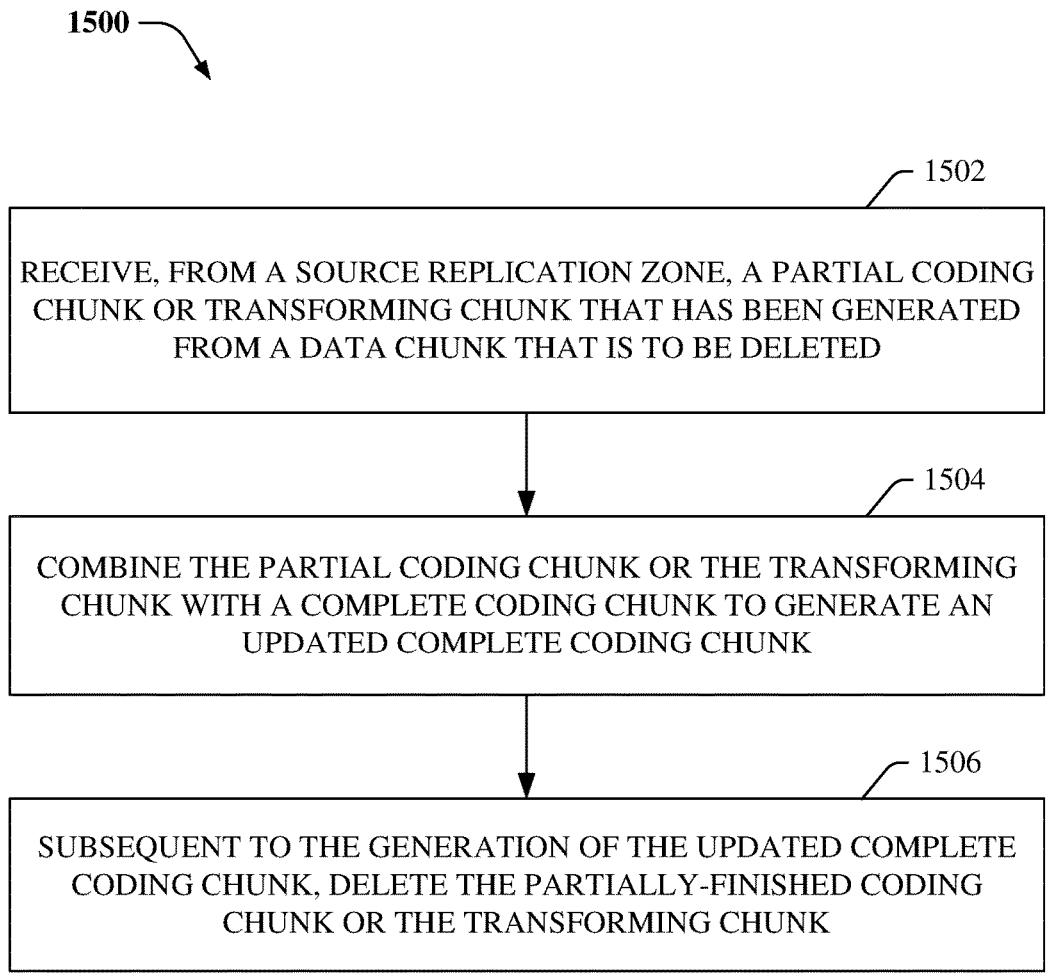
FIG. 15 illustrates an example method that updates coding chunks, according to an aspect of the specification.

FIGS. 13-15 illustrate flow diagrams and/or methods in accordance with the disclosed subject matter. For simplicity of explanation, the flow diagrams and/or methods are depicted and described as a series of acts. It is to be understood and appreciated that the various embodiments are not limited by the acts illustrated and/or by the order of acts, for example acts can occur in various orders and/or concurrently, and with other acts not presented and described herein. Furthermore, not all illustrated acts may be required to implement the flow diagrams and/or methods in accordance with the disclosed subject matter. In addition, those skilled in the art will understand and appreciate that the methods could alternatively be represented as a series of interrelated states via a state diagram or events. Additionally, it should be further appreciated that the methods disclosed hereinafter and throughout this specification are capable of being stored on an article of manufacture to facilitate transporting and transferring such methods to computers. The term article of manufacture, as used herein, is intended to encompass a computer program accessible from any computer-readable device or computer-readable storage/communications media.

Referring now to FIG. 13, there illustrated is an example method 1300 for updating coding chunks in response to determining that a data chunk is to be deleted. At 1302, it can be determined that a data chunk stored within a first zone of a data store is to be deleted. Moreover, the data chunk has previously been replicated (e.g., to a destination zone) by utilizing GEO erasure coding. At 1304, in response to the determining that the data chunk is to be deleted, a group of partial coding chunks can be generated. As an example, the group of partial coding chunks can be generated by combining (e.g., multiplying) the data chunk with corresponding coefficients from a defined coding matrix. At 1306, the group of partial coding chunks can be transferred to respective remote zones that store complete coding chunks associated with the data chunk to facilitate modification of the complete coding chunks. As an example, the modification results in removal of information related to the data chunk from the complete coding chunks. Further, at 1308, in response to determining that the complete coding chunks have been modified, the data chunk can be deleted.

FIG. 14 illustrates is an example method 1400 for updating coding chunks in response to determining that a first data chunk is to be deleted and a second data chunk is to be protected using distributed erasure coding. At 1402, it can be determined that a first data chunk stored within a first zone of a data store is to be deleted. Moreover, the first data chunk has been replicated (e.g., to a destination zone) by utilizing distributed erasure coding. At 1404, it can be determined that a second data chunk within the first zone is to be replicated by utilizing distributed erasure coding. At 1406, in response to the determining that the first data chunk is to be deleted and the second data chunk is to be replicated, a group of partial coding chunks can be generated for the first and second data chunks. As an example, a first set of partial coding chunks can be generated by combining (e.g., multiplying) the first data chunk with corresponding coefficients from a first coding matrix and a second set of partial coding chunks can be generated by combining (e.g., multiplying) the second data chunk with corresponding coefficients from a second coding matrix (or the first coding matrix). At 1408, the partial coding chunks can be combined (e.g., XORed) to generate transforming chunks.

At 1410, the transforming chunks can be transferred to respective remote zones that store complete coding chunks associated with the first data chunk to facilitate a modification of the complete coding chunks. As an example, the modification results in removal of any information related to the first data chunk from the complete coding chunks and addition of information related to protection of the second data chunk. Further, at 1412, in response to determining that the complete coding chunks have been modified, the first data chunk can be deleted.

FIG. 15 illustrates an example method 1500 that updates coding chunks, according to an aspect of the specification. At 1502, a partial coding chunk or a transforming chunk can be received from a source replication zone. In one example, the partial coding chunk can be generated based on multiplying a to-be-deleted data chunk with corresponding coefficients from a defined coding matrix. In another example, the transforming chunk can be generated based on combining a partial coding chunk associated with a to-be-deleted data chunk with a partial coding chunk associated with a to-be-replicated data chunk.

At 1504, the partial coding chunk or the transforming chunk can be combined (e.g., XORed) with a complete coding chunk to generate an updated complete coding chunk, for example, that can be utilized to facilitate data recovery (e.g., in case the data chunks are lost/unavailable). At 906, subsequent to the generation of the updated complete coding chunk, the partial coding chunk or the transforming chunk can be deleted.

Figure 16:
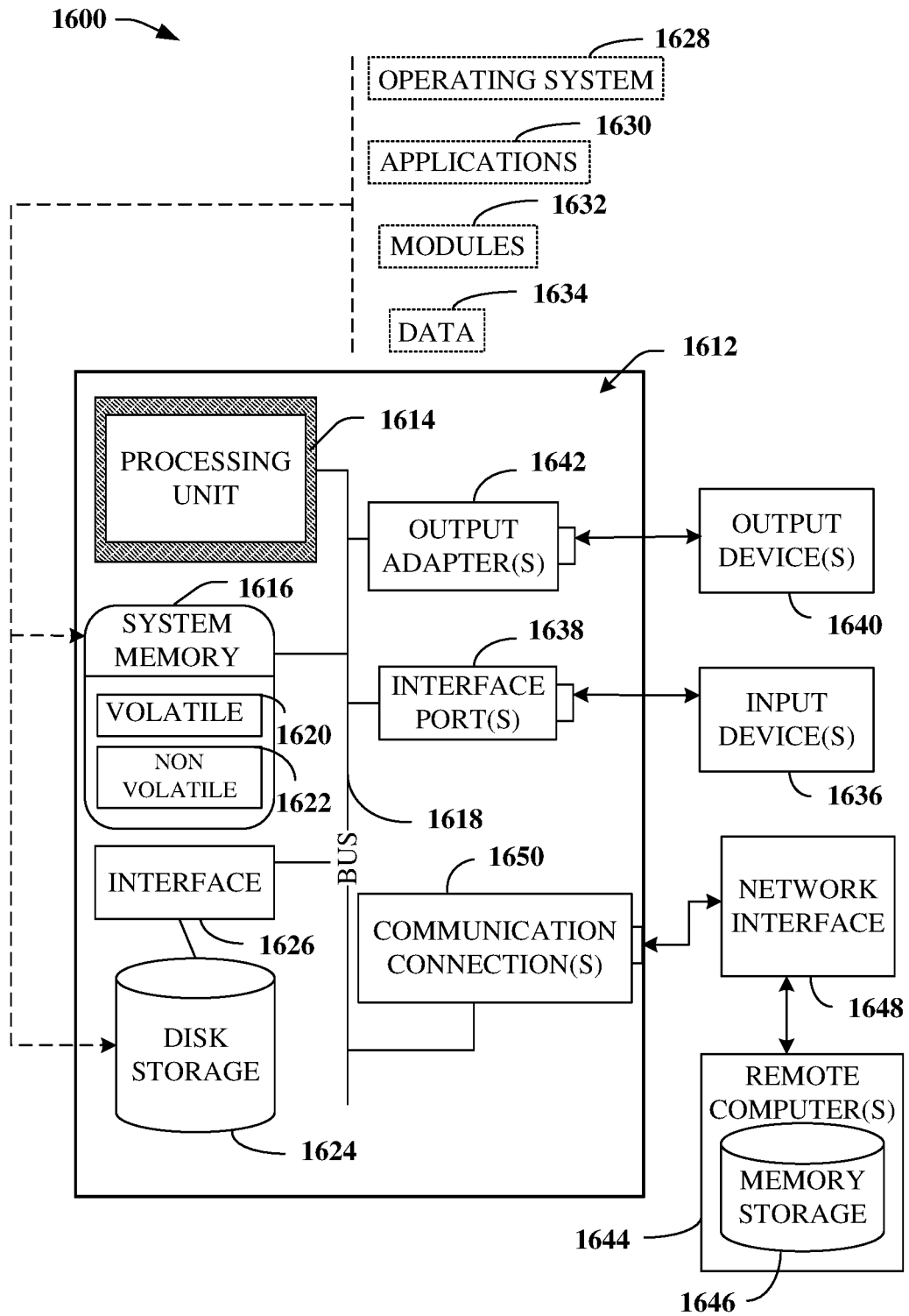
FIG. 16 illustrates a block diagram of an example computer operable to execute the disclosed distributed storage system architecture.

Referring now to FIG. 16, there is illustrated a block diagram of an example computer operable to execute data deletion with distributed erasure coding. In order to provide additional context for various aspects of the disclosed subject matter, FIG. 16 and the following discussion are intended to provide a brief, general description of a suitable computing environment 1600 in which the various aspects of the specification can be implemented. While the specification has been described above in the general context of computer-executable instructions that can run on one or more computers, those skilled in the art will recognize that the specification also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices, microprocessor-based or programmable consumer electronics, and the like, each of which can be operatively coupled to one or more associated devices. The illustrated aspects of the specification can also be practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media and/or communications media, which two terms are used herein differently from one another as follows. Computer-readable storage media can be any available storage media that can be accessed by the computer and includes both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, (e.g., a carrier wave or other transport mechanism), and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, radio frequency (RF), infrared and other wireless media.

In order to provide a context for the various aspects of the disclosed subject matter, FIG. 16, and the following discussion, are intended to provide a brief, general description of a suitable environment in which the various aspects of the disclosed subject matter can be implemented. While the subject matter has been described above in the general context of computer-executable instructions of a computer program that runs on a computer and/or computers, those skilled in the art will recognize that various embodiments disclosed herein can be implemented in combination with other program modules. Generally, program modules comprise routines, programs, components, data structures, etc. that perform particular tasks and/or implement particular abstract data types.

Moreover, those skilled in the art will appreciate that the inventive systems can be practiced with other computer system configurations, comprising single-processor or multiprocessor computer systems, computing devices, mini-computing devices, mainframe computers, as well as personal computers, hand-held computing devices (e.g., PDA, phone, watch), microprocessor-based or programmable consumer or industrial electronics, and the like. The illustrated aspects can also be practiced in distributed computing environments where tasks are performed by remote processing devices that are linked through a communication network; however, some if not all aspects of the subject disclosure can be practiced on stand-alone computers. In a distributed computing environment, program modules can be located in both local and remote memory storage devices.

With reference to FIG. 16, a block diagram of a computing system 1600 operable to execute the disclosed systems and methods is illustrated, in accordance with an embodiment. Computer 1612 comprises a processing unit 1614, a system memory 1616, and a system bus 1618. As an example, the component(s), server(s), node(s), cluster(s), system(s), zone(s), module(s), agent(s), engine(s), and/or device(s) disclosed herein with respect to systems 100-1200 can each include at least a portion of the computing system 1600. System bus 1618 couples system components comprising, but not limited to, system memory 1616 to processing unit 1614. Processing unit 1614 can be any of various available processors. Dual microprocessors and other multiprocessor architectures also can be employed as processing unit 1614.

System bus 1618 can be any of several types of bus structure(s) comprising a memory bus or a memory controller, a peripheral bus or an external bus, and/or a local bus using any variety of available bus architectures comprising, but not limited to, industrial standard architecture (ISA), micro-channel architecture (MSA), extended ISA (EISA), intelligent drive electronics (IDE), VESA local bus (VLB), peripheral component interconnect (PCI), card bus, universal serial bus (USB), advanced graphics port (AGP), personal computer memory card international association bus (PCMCIA), Firewire (IEEE 1394), small computer systems interface (SCSI), and/or controller area network (CAN) bus used in vehicles.

System memory 1616 comprises volatile memory 1620 and nonvolatile memory 1622. A basic input/output system (BIOS), containing routines to transfer information between elements within computer 1612, such as during start-up, can be stored in nonvolatile memory 1622. By way of illustration, and not limitation, nonvolatile memory 1622 can comprise ROM, PROM, EPROM, EEPROM, or flash memory. Volatile memory 1620 comprises RAM, which acts as external cache memory. By way of illustration and not limitation, RAM is available in many forms such as SRAM, dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Computer 1612 also comprises removable/non-removable, volatile/non-volatile computer storage media. FIG. 16 illustrates, for example, disk storage 1624. Disk storage 1624 comprises, but is not limited to, devices like a magnetic disk drive, floppy disk drive, tape drive, Jaz drive, Zip drive, LS-100 drive, flash memory card, or memory stick. In addition, disk storage 1624 can comprise storage media separately or in combination with other storage media comprising, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1624 to system bus 1618, a removable or non-removable interface is typically used, such as interface 1626.

It is to be appreciated that FIG. 16 describes software that acts as an intermediary between users and computer resources described in suitable operating environment 1600. Such software comprises an operating system 1628. Operating system 1628, which can be stored on disk storage 1624, acts to control and allocate resources of computer system 1612. System applications 1630 take advantage of the management of resources by operating system 1628 through program modules 1632 and program data 1634 stored either in system memory 1616 or on disk storage 1624. It is to be appreciated that the disclosed subject matter can be implemented with various operating systems or combinations of operating systems.

A user can enter commands or information into computer 1612 through input device(s) 1636. Input devices 1636 comprise, but are not limited to, a pointing device such as a mouse, trackball, stylus, touch pad, keyboard, microphone, joystick, game pad, satellite dish, scanner, TV tuner card, digital camera, digital video camera, web camera, cellular phone, user equipment, smartphone, and the like. These and other input devices connect to processing unit 1614 through system bus 1618 via interface port(s) 1638. Interface port(s) 1638 comprise, for example, a serial port, a parallel port, a game port, a universal serial bus (USB), a wireless based port, e.g., Wi-Fi, Bluetooth®, etc. Output device(s) 1640 use some of the same type of ports as input device(s) 1636.

Thus, for example, a USB port can be used to provide input to computer 1612 and to output information from computer 1612 to an output device 1640. Output adapter 1642 is provided to illustrate that there are some output devices 1640, like display devices, light projection devices, monitors, speakers, and printers, among other output devices 1640, which use special adapters. Output adapters 1642 comprise, by way of illustration and not limitation, video and sound devices, cards, etc. that provide means of connection between output device 1640 and system bus 1618. It should be noted that other devices and/or systems of devices provide both input and output capabilities such as remote computer(s) 1644.

Computer 1612 can operate in a networked environment using logical connections to one or more remote computers, such as remote computer(s) 1644. Remote computer(s) 1644 can be a personal computer, a server, a router, a network PC, a workstation, a microprocessor based appliance, a peer device, or other common network node and the like, and typically comprises many or all of the elements described relative to computer 1612.

For purposes of brevity, only a memory storage device 1646 is illustrated with remote computer(s) 1644. Remote computer(s) 1644 is logically connected to computer 1612 through a network interface 1648 and then physically and/or wirelessly connected via communication connection 1650. Network interface 1648 encompasses wire and/or wireless communication networks such as local-area networks (LAN) and wide-area networks (WAN). LAN technologies comprise fiber distributed data interface (FDDI), copper distributed data interface (CDDI), Ethernet, token ring and the like. WAN technologies comprise, but are not limited to, point-to-point links, circuit switching networks like integrated services digital networks (ISDN) and variations thereon, packet switching networks, and digital subscriber lines (DSL).

Communication connection(s) 1650 refer(s) to hardware/software employed to connect network interface 1648 to bus 1618. While communication connection 1650 is shown for illustrative clarity inside computer 1612, it can also be external to computer 1612. The hardware/software for connection to network interface 1648 can comprise, for example, internal and external technologies such as modems, comprising regular telephone grade modems, cable modems and DSL modems, wireless modems, ISDN adapters, and Ethernet cards.

The computer 1612 can operate in a networked environment using logical connections via wired and/or wireless communications to one or more remote computers, cellular based devices, user equipment, smartphones, or other computing devices, such as workstations, server computers, routers, personal computers, portable computers, microprocessor-based entertainment appliances, peer devices or other common network nodes, etc. The computer 1612 can connect to other devices/networks by way of antenna, port, network interface adaptor, wireless access point, modem, and/or the like.

The computer 1612 is operable to communicate with any wireless devices or entities operatively disposed in wireless communication, e.g., a printer, scanner, desktop and/or portable computer, portable data assistant, communications satellite, user equipment, cellular base device, smartphone, any piece of equipment or location associated with a wirelessly detectable tag (e.g., scanner, a kiosk, news stand, restroom), and telephone. This comprises at least Wi-Fi and Bluetooth® wireless technologies. Thus, the communication can be a predefined structure as with a conventional network or simply an ad hoc communication between at least two devices.

The computing system 1600 is operable to communicate with any wireless devices or entities operatively disposed in wireless communication, e.g., desktop and/or portable computer, server, communications satellite, etc. This includes at least WiFi and Bluetooth® wireless technologies. Thus, the communication can be a predefined structure as with a conventional network or simply an ad hoc communication between at least two devices.

WiFi, or Wireless Fidelity, allows connection to the Internet from a couch at home, a bed in a hotel room, or a conference room at work, without wires. WiFi is a wireless technology similar to that used in a cell phone that enables such devices, e.g., computers, to send and receive data indoors and out; anywhere within the range of a base station. WiFi networks use radio technologies called IEEE 802.11 (a, b, g, n, etc.) to provide secure, reliable, fast wireless connectivity. A WiFi network can be used to connect computers to each other, to the Internet, and to wired networks (which use IEEE 802.3 or Ethernet). WiFi networks operate in the unlicensed 5 GHz radio band at a 54 Mbps (802.11a) data rate, and/or a 2.4 GHz radio band at an 11 Mbps (802.11b), a 54 Mbps (802.11g) data rate, or up to a 600 Mbps (802.11n) data rate for example, or with products that contain both bands (dual band), so the networks can provide real-world performance similar to the basic 10BaseT wired Ethernet networks used in many offices.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory in a single machine or multiple machines. Additionally, a processor can refer to an integrated circuit, a state machine, an application specific integrated circuit (ASIC), a digital signal processor (DSP), a programmable gate array (PGA) including a field programmable gate array (FPGA), a programmable logic controller (PLC), a complex programmable logic device (CPLD), a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units. One or more processors can be utilized in supporting a virtualized computing environment. The virtualized computing environment may support one or more virtual machines representing computers, servers, or other computing devices. In such virtualized virtual machines, components such as processors and storage devices may be virtualized or logically represented. In an aspect, when a processor executes instructions to perform "operations", this could include the processor performing the operations directly and/or facilitating, directing, or cooperating with another device or component to perform the operations In the subject specification, terms such as "data store," data storage," "database," "cache," and substantially any other information storage component relevant to operation and functionality of a component, refer to "memory components," or entities embodied in a "memory" or components comprising the memory. It is noted that the memory components, or computer-readable storage media, described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

The illustrated aspects of the disclosure can be practiced in distributed computing environments where certain tasks are performed by remote processing devices that are linked through a communications network. In a distributed computing environment, program modules can be located in both local and remote memory storage devices.

The systems and processes described above can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders that are not all of which may be explicitly illustrated herein.

As used in this application, the terms "component," "module," "system," "interface," "cluster," "server," "node," or the like are generally intended to refer to a computer-related entity, either hardware, a combination of hardware and software, software, or software in execution or an entity related to an operational machine with one or more specific functionalities. For example, a component can be, but is not limited to being, a process running on a processor, a processor, an object, an executable, a thread of execution, computer-executable instruction(s), a program, and/or a computer. By way of illustration, both an application running on a controller and the controller can be a component. One or more components may reside within a process and/or thread of execution and a component may be localized on one computer and/or distributed between two or more computers. As another example, an interface can include input/output (I/O) components as well as associated processor, application, and/or API components.

Furthermore, the terms "user," "consumer," "client," and the like are employed interchangeably throughout the subject specification, unless context warrants particular distinction(s) among the terms. It is noted that such terms can refer to human entities or automated components/devices supported through artificial intelligence (e.g., a capacity to make inference based on complex mathematical formalisms), which can provide simulated vision, sound recognition and so forth.

Further, the various embodiments can be implemented as a method, apparatus, or article of manufacture using standard programming and/or engineering techniques to produce software, firmware, hardware, or any combination thereof to control a computer to implement one or more aspects of the disclosed subject matter. An article of manufacture can encompass a computer program accessible from any computer-readable device or computer-readable storage/communications media. For example, computer readable storage media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Of course, those skilled in the art will recognize many modifications can be made to this configuration without departing from the scope or spirit of the various embodiments.

Artificial intelligence based systems, e.g., utilizing explicitly and/or implicitly trained classifiers, can be employed in connection with performing inference and/or probabilistic determinations and/or statistical-based determinations as in accordance with one or more aspects of the disclosed subject matter as described herein. For example, an artificial intelligence system can be used to dynamically perform operations as described herein.

A classifier can be a function that maps an input attribute vector, $x=(x1, x2, x3, x4, xn)$, to a confidence that the input belongs to a class, that is, $f(x)$=confidence (class). Such classification can employ a probabilistic and/or statistical-based analysis (e.g., factoring into the analysis utilities and costs) to infer an action that a user desires to be automatically performed. In the case of communication systems, for example, attributes can be information received from access points, servers, components of a wireless communication network, etc., and the classes can be categories or areas of interest (e.g., levels of priorities). A support vector machine is an example of a classifier that can be employed. The support vector machine operates by finding a hypersurface in the space of possible inputs, which the hypersurface attempts to split the triggering criteria from the non-triggering events. Intuitively, this makes the classification correct for testing data that is near, but not identical to training data. Other directed and undirected model classification approaches include, e.g., naïve Bayes, Bayesian networks, decision trees, neural networks, fuzzy logic models, and probabilistic classification models providing different patterns of independence can be employed. Classification as used herein can also be inclusive of statistical regression that is utilized to develop models of priority.

In accordance with various aspects of the subject specification, artificial intelligence based systems, components, etc. can employ classifiers that are explicitly trained, e.g., via a generic training data, etc. as well as implicitly trained, e.g., via observing characteristics of communication equipment, e.g., a server, etc., receiving reports from such communication equipment, receiving operator preferences, receiving historical information, receiving extrinsic information, etc. For example, support vector machines can be configured via a learning or training phase within a classifier constructor and feature selection module. Thus, the classifier(s) can be used by an artificial intelligence system to automatically learn and perform a number of functions.

In addition, the word "example" or "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

What has been described above includes examples of the present specification. It is, of course, not possible to describe every conceivable combination of components or methods for purposes of describing the present specification, but one of ordinary skill in the art may recognize that many further combinations and permutations of the present specification are possible. Accordingly, the present specification is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A system, comprising:
a processor; and
a memory that stores executable instructions that, when executed by the processor, facilitate performance of operations, comprising:
in response to determining that a data chunk stored within a first zone of a geographically distributed storage system is to be deleted, determining a group of partial coding chunks associated with the data chunk,
determining a second zone of the geographically distributed storage system that stores a complete coding chunk associated with the data chunk, wherein the complete coding chunk is determined based on an erasure coding of the data chunk, and
directing, to the second zone, a partial coding chunk of the group of partial coding chunks to facilitate a modification of the complete coding chunk, wherein the modification results in a removal of information related to the data chunk from the complete coding chunk.

2. The system of claim 1, wherein the determining the group of partial coding chunks comprises determining the group of partial coding chunks based on defined coding matrix data.

3. The system of claim 2, wherein the defined coding matrix data comprises a set of defined coefficients, and wherein the partial coding chunk is determined based on a result of multiplying the data chunk with a coefficient of the set of defined coefficients.

4. The system of claim 1, wherein the modification comprises a combination of the complete coding chunk with the partial coding chunk.

5. The system of claim 1, wherein the operations further comprise:
   subsequent to the modification, deleting the data chunk.

6. The system of claim 1, wherein the operations further comprise:
   subsequent to the modification, deleting the partial coding chunk.

7. The system of claim 1, wherein the modification results in a modified complete coding chunk that is stored within the second zone.

8. The system of claim 1, wherein the geographically distributed storage system comprises a geographically distributed object storage system.

* * * * *